(12) United States Patent
Paranjpe et al.

(10) Patent No.: US 10,985,046 B2
(45) Date of Patent: Apr. 20, 2021

(54) MICRO-LED TRANSFER METHODS USING LIGHT-BASED DEBONDING

(71) Applicant: Veeco Instruments Inc., Plainview, NY (US)

(72) Inventors: Ajit P. Paranjpe, Basking Ridge, NJ (US); Christopher J. Morath, Basking Ridge, NJ (US)

(73) Assignee: Veeco Instruments Inc., Plainview, NY (US)

( * ) Notice: Subject to any disclaimer, the term of this patent is extended or adjusted under 35 U.S.C. 154(b) by 0 days.

(21) Appl. No.: 16/520,674

(22) Filed: Jul. 24, 2019

(65) Prior Publication Data
US 2019/0393069 A1 Dec. 26, 2019

Related U.S. Application Data

(63) Continuation of application No. PCT/US2019/038186, filed on Jun. 20, 2019.
(Continued)

(51) Int. Cl.
H01L 33/00 (2010.01)
H01L 21/683 (2006.01)
(Continued)

(52) U.S. Cl.
CPC ............ *H01L 21/6835* (2013.01); *B32B 7/12* (2013.01); *B32B 37/025* (2013.01); *H01L 25/0753* (2013.01); *H01L 33/62* (2013.01); *B32B 2457/20* (2013.01); *H01L 2221/68354* (2013.01); *H01L 2221/68363* (2013.01);
(Continued)

(58) Field of Classification Search
None
See application file for complete search history.

(56) References Cited

U.S. PATENT DOCUMENTS

| | | | |
|---|---|---|---|
| 2003/0162463 A1 | 8/2003 | Hayashi et al. | |
| 2004/0137662 A1 | 7/2004 | Yanagisawa et al. | |

(Continued)

FOREIGN PATENT DOCUMENTS

| | | | | |
|---|---|---|---|---|
| KR | 20180024228 | * | 3/2018 | ............ H01L 33/00 |
| KR | 20180024228 A | | 3/2018 | |

OTHER PUBLICATIONS

Chen et al., "High-Speed Precision Handling Technology of Micro-Chip for Fan-Out Wafer Level Packaging (FOWLP) Application." 2018 IEEE 68th Electronic Components and Technology Conference, pp. 1975-1980.
(Continued)

*Primary Examiner* — Reema Patel
(74) *Attorney, Agent, or Firm* — Downs Rachlin Martin PLLC

(57) ABSTRACT

Transfer methods disclosed herein include transferring micro-LEDs from a first carrier to a second carrier. The methods include bonding the micro-LEDs to the first carrier using a first releasable bonding layer that releases when exposed to actinic light. The micro-LEDs are then secured to a second carrier. The first bonding layer is then irradiated through the first releasable bonding layer through the first carrier with the actinic light to release the micro-LEDs from the first carrier. The second carrier can be a display backplane having bonding pads and the micro-LEDs can be secured to the bonding pads.

25 Claims, 29 Drawing Sheets

Related U.S. Application Data

(60) Provisional application No. 62/688,785, filed on Jun. 22, 2018.

(51) Int. Cl.
*H01L 25/075* (2006.01)
*H01L 33/62* (2010.01)
*B32B 37/00* (2006.01)
*B32B 7/12* (2006.01)

(52) U.S. Cl.
CPC ............... *H01L 2221/68381* (2013.01); *H01L 2933/0066* (2013.01)

(56) References Cited

U.S. PATENT DOCUMENTS

| | | | |
|---|---|---|---|
| 2005/0142391 A1* | 6/2005 | Dmitriev et al. | B23B 9/00 428/98 |
| 2008/0258133 A1* | 10/2008 | Seong | H01L 31/20 257/14 |
| 2012/0044255 A1 | 2/2012 | Singh et al. | |
| 2014/0106480 A1 | 4/2014 | Yoo et al. | |
| 2017/0162552 A1 | 6/2017 | Thompson | |
| 2017/0194186 A1 | 7/2017 | Andry et al. | |
| 2017/0358623 A1 | 12/2017 | Thothadri et al. | |

OTHER PUBLICATIONS

PCT International Search Report dated Oct. 4, 2019, in International Application No. PCT/US2019/038186 filed on Jun. 20, 2019.

* cited by examiner

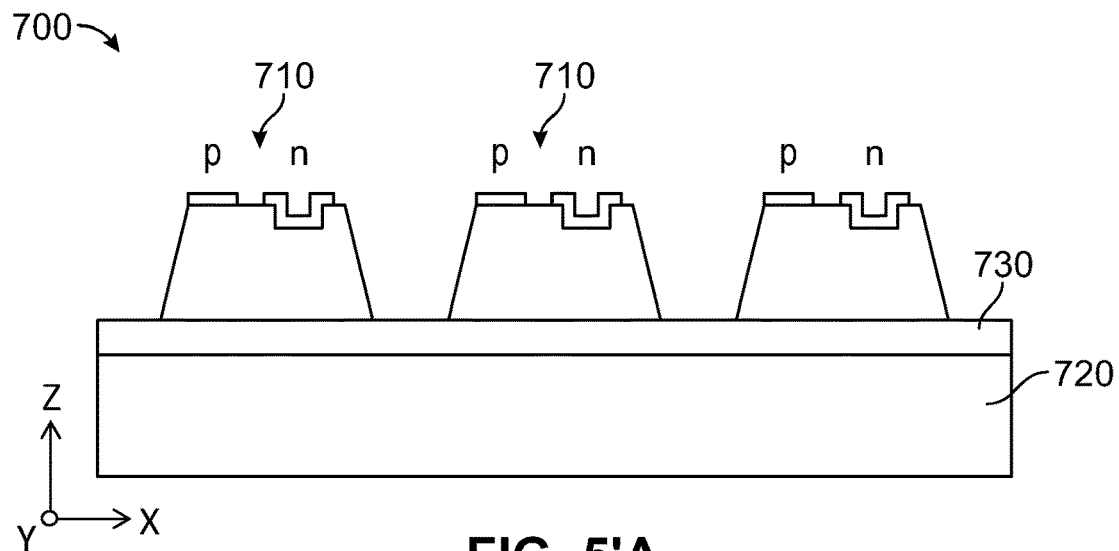
FIG. 5'A
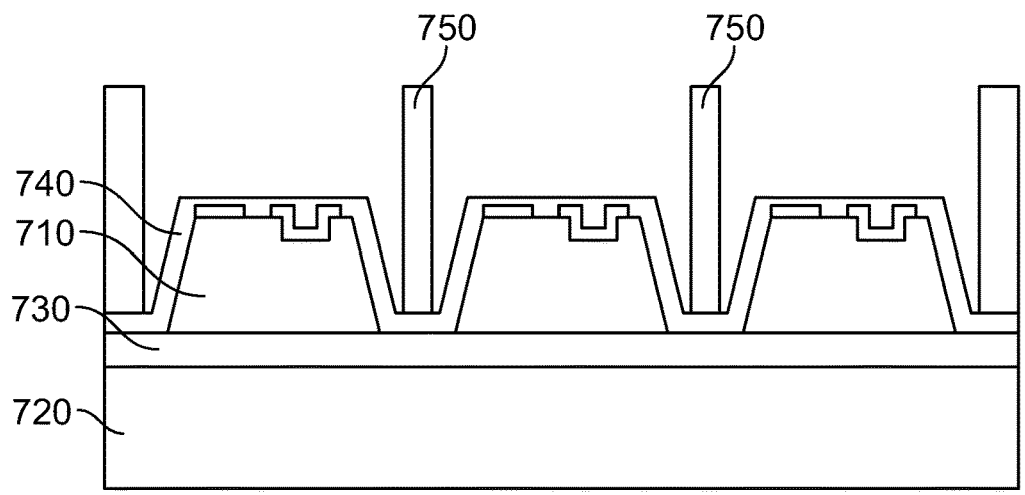
FIG. 5'B
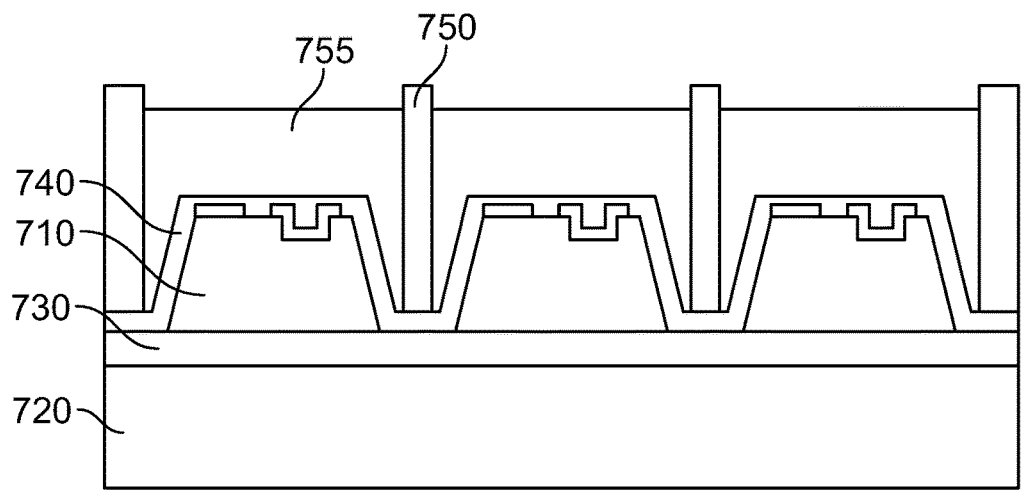
FIG. 5'C

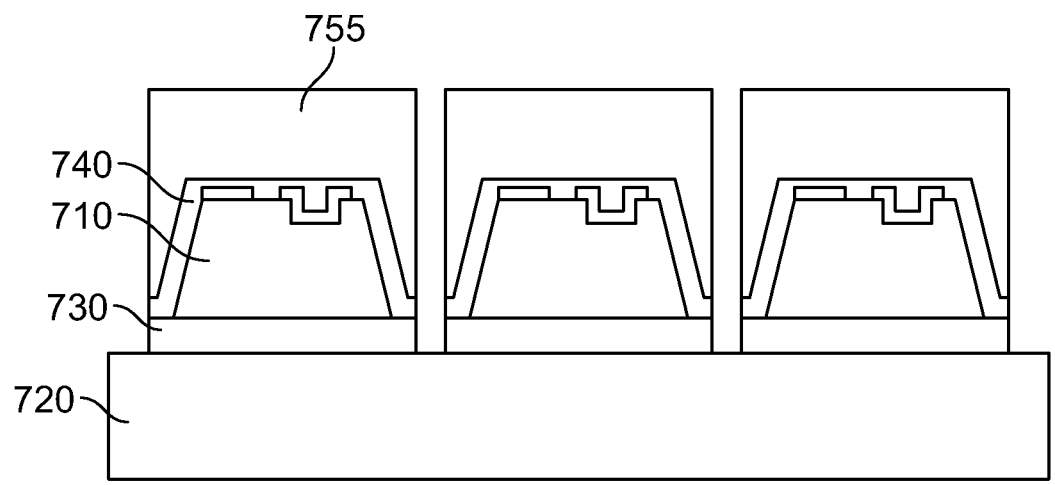
FIG. 5'D
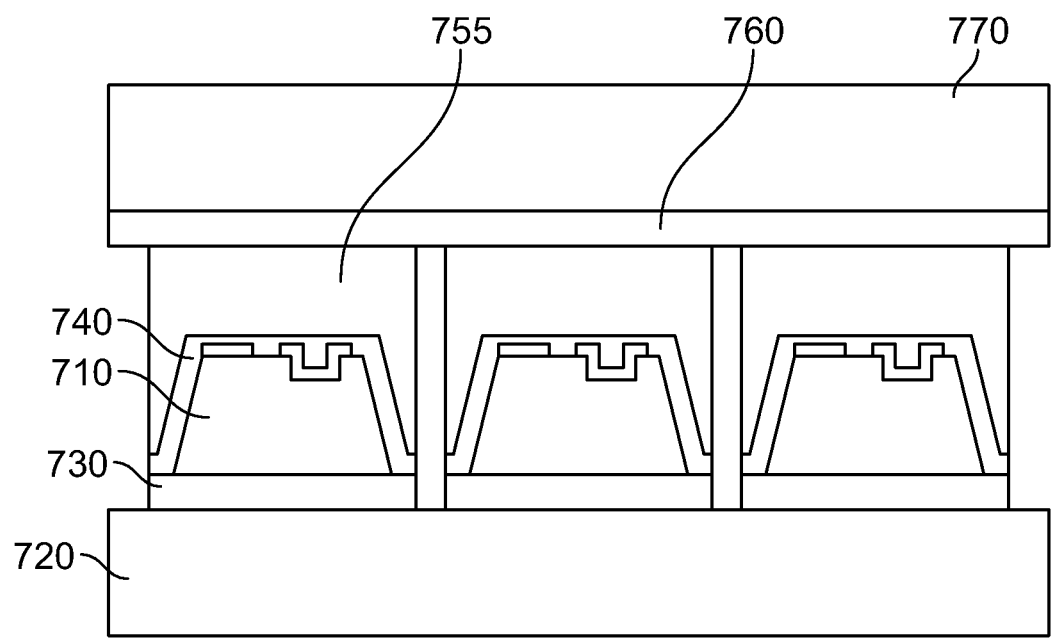
FIG. 5'E

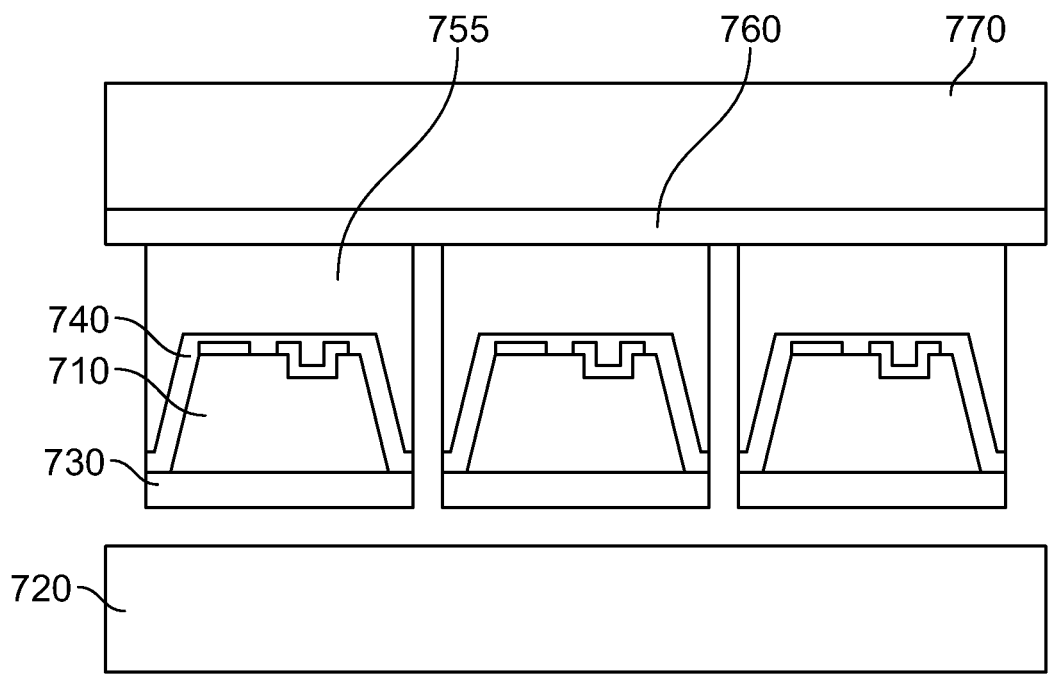
FIG. 5'F
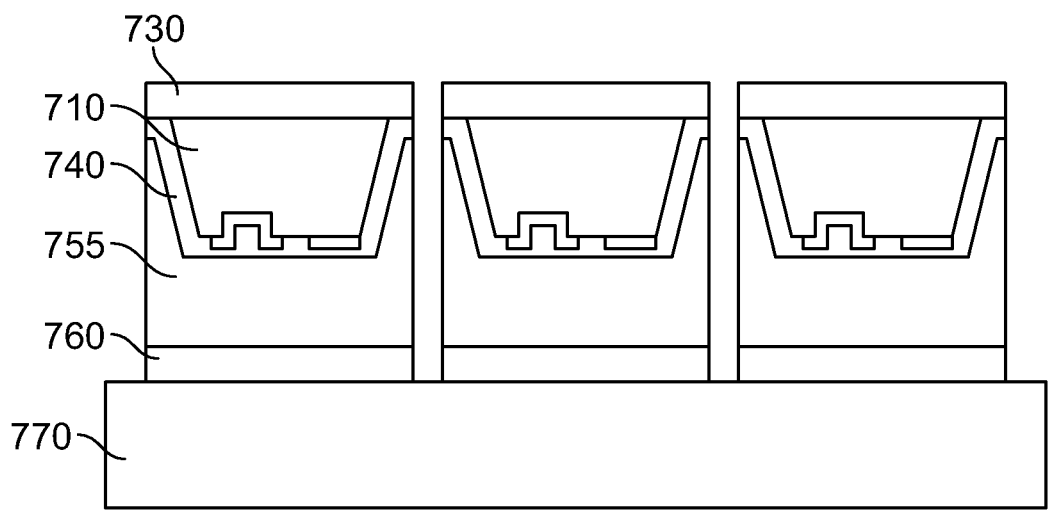
FIG. 5'G

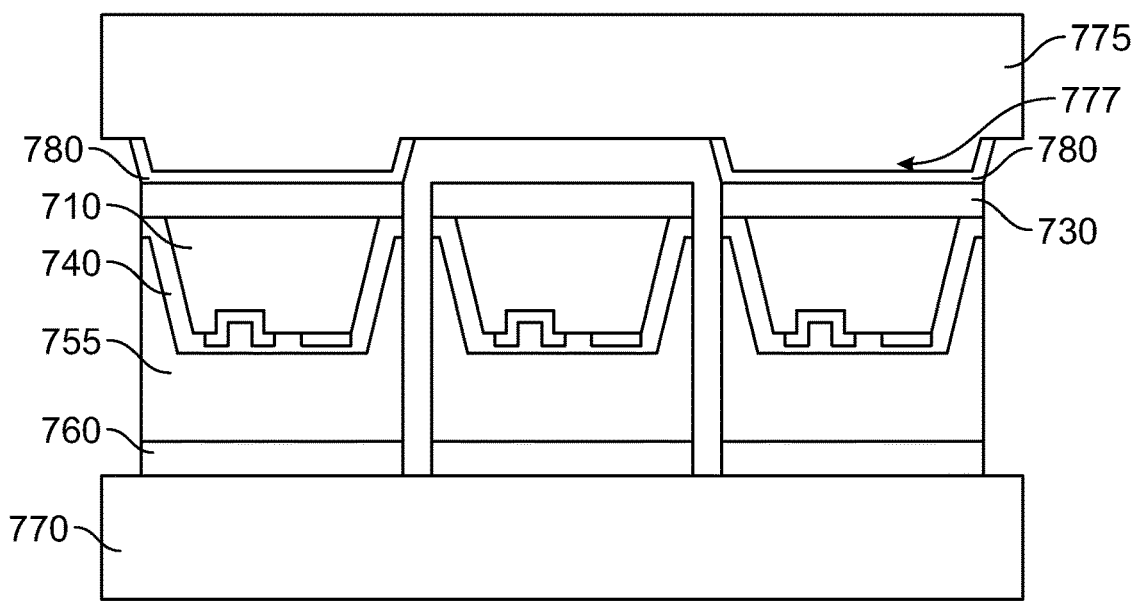
FIG. 5'H
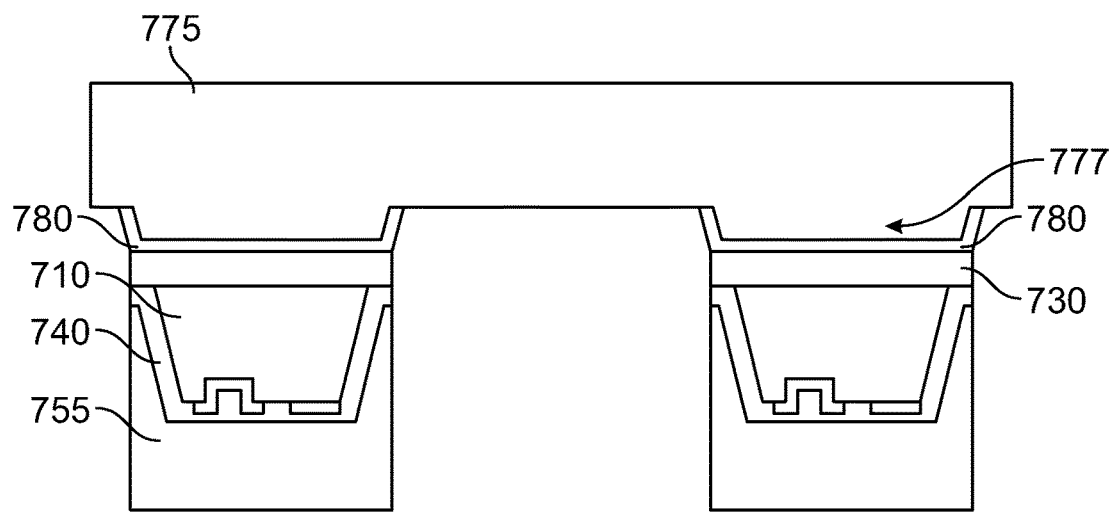
FIG. 5'I
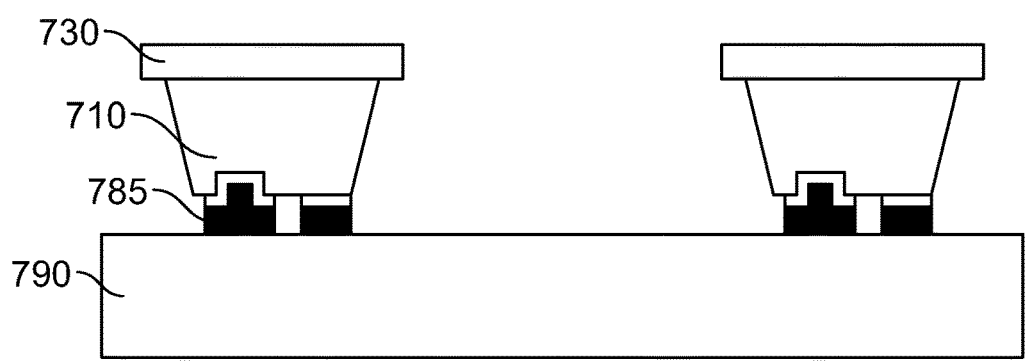
FIG. 5'J

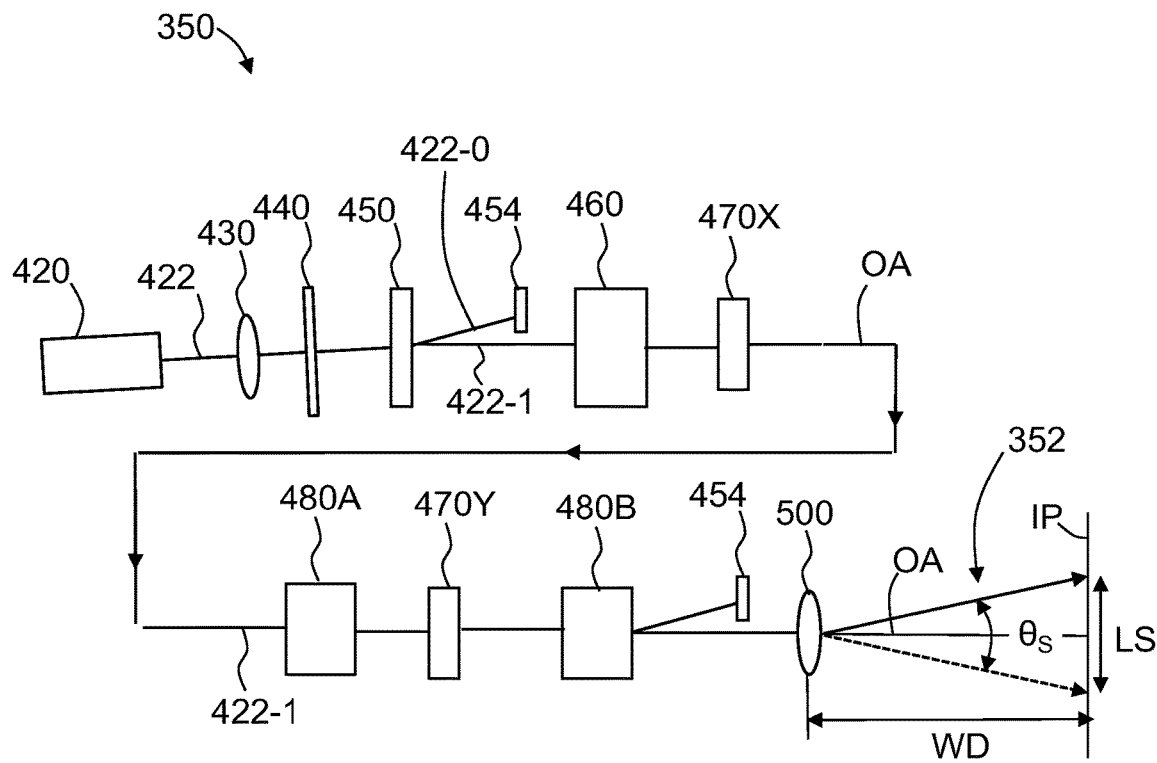
*FIG. 10A*
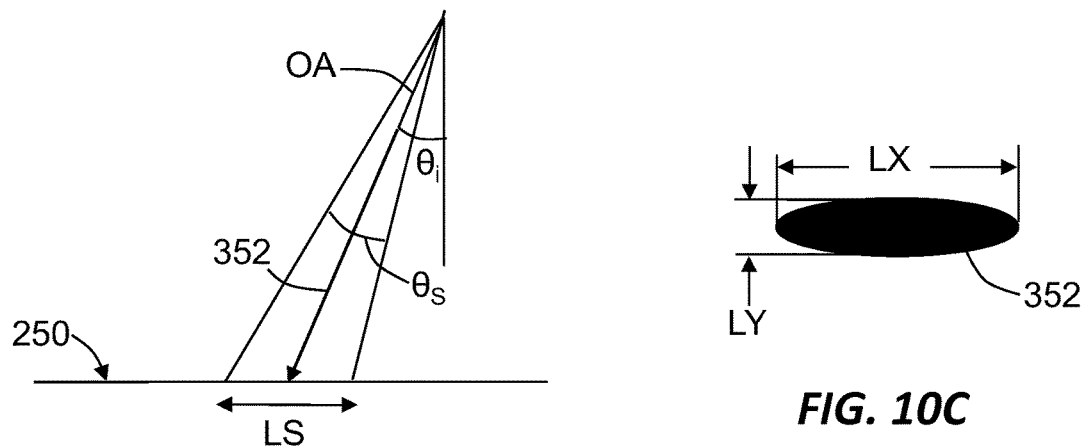
*FIG. 10B*
*FIG. 10C*

MICRO-LED TRANSFER METHODS USING LIGHT-BASED DEBONDING

RELATED APPLICATION DATA

This application is a continuation of International Patent Application No. PCT/US2019/038186, filed on Jun. 20, 2019, and titled "Micro-LED Transfer Methods Using Light-Based Debonding," which application claims the benefit of priority of U.S. Provisional Patent Application Ser. No. 62/688,785, filed Jun. 22, 2018, and titled "Micro-LED Transfer Methods Using Light-Based Debonding," each of which is incorporated by reference herein in its entirety.

FIELD

The present disclosure relates to micro-LEDs and micro-LED displays, and in particular to micro-LED transfer methods using light-based debonding.

BACKGROUND

Micro-LED displays utilize small LEDs (e.g., chip sizes below 100 µm) mounted to a display backplane that includes wiring to power the micro-LEDs. Color micro-LED displays employ triads (pixels) of red, green and blue (RGB) micro-LEDs. Sometimes the term "micro-LED" refers to chips that are smaller than 30 µm while the term "mini-LED" refers to chips have an intermediate size between 30 µm and conventional LED chips (>150 µm). The term "micro-LED" as used herein does not distinguish between mini-LEDs and micro-LEDs and both are included in the term "micro-LED."

Micro-LED displays offer superior brightness, higher power efficiency, and are more robust and flexible than other display technologies, such as back-lit LED displays, OLED displays and plasma displays. For this reason, micro-LED displays can, in principle, address a range of display applications from smart phones to HDTVs to large-scale outdoor displays.

A disadvantage of micro-LED displays is their fabrication complexity. Fabricating a micro-LED display requires placing the micro-LEDs on the display backplane. For example, fabricating full HD (FHD) micro-LED display of 1920× 1080 RGB pixels requires placing about six million micro-LEDs with a final yield over 99.9999%. To meet the cost targets for many applications (and for smartphones in particular), the micro-LED chip sizes have to be smaller than 10 µm, preferably smaller than 5 µm, and ideally as small as 3 µm. This further complicates the micro-LED placement (transfer) process.

The micro-LEDs are transferred to a display backplane in sets called transfer fields. Typical transfer fields are relatively small (e.g., 10 mm-50 mm) so that multiple transfer fields are required to populate the display backplane. For example, for a 15 mm×15 mm transfer field, over 40 transfers per color or 120 transfers in total are required to populate a single 5.5" full high definition (FHD) smartphone color display.

In addition, to avoid a checker-board effect on the final micro-LED display caused by sharp gradients in the micro-LED emission wavelength or brightness at the boundaries between adjacent transfer fields, the wavelength and brightness must be substantially uniform across the transfer field. A wavelength variation of <1 nm and brightness variation of <10% is desired to avoid sharp gradients in the color gamut white point at the boundaries of the transfer fields.

In view of the above, there is a need for more efficient fabrication methods for micro-LED displays, and in particular to more efficient micro-LED transfer methods.

SUMMARY

An aspect of the disclosure is directed to a method of transferring a micro-LED from a first carrier to a second carrier. The method comprises: a) bonding the micro-LED to the first carrier using a first releasable bonding layer that releases when exposed to actinic light; b) securing the micro-LED to the second carrier; and c) irradiating the first releasable bonding layer through the first carrier with the actinic light to release the micro-LED from the first carrier. The second carrier can comprise a display backplane having a bonding pad, and the method can further comprise: transferring the micro-LED from the first carrier to the bonding pad; and operably securing the transferred micro-LED to the bonding pad.

Another aspect of the disclosure is directed to a method of transferring one or more of multiple micro-LEDs from a first carrier to a second carrier. The method comprises: a) bonding the multiple micro-LEDs to the first carrier using respective first releasable bonding segments that release when exposed to actinic light; b) securing the multiple micro-LEDs to the second carrier; c) irradiating one or more of the first releasable bonding segments through the first carrier with the actinic light to release one or more of the multiple micro-LEDs from the first carrier; and d) selectively releasing the other of the one or more multiple micro-LEDs from the second carrier so that only the one or more of the multiple micro-LEDs are supported only by the second carrier and so that only the other of the one or more multiple micro-LEDS is supported by the first carrier.

Another aspect of the disclosure is directed to a method of transferring one or more of multiple micro-LEDs from a first carrier to a second carrier. The method comprises: a) bonding the multiple micro-LEDs to the first carrier using a layer of a releasable bonding material that releases when exposed to actinic light; b) securing select micro-LEDs of the multiple micro-LEDs to the second carrier using respective segments of the releasable bonding material; and c) irradiating the first releasable bonding layer through the first carrier with the actinic light to release the select multiple micro-LEDs from the first carrier so that the select micro-LEDs are supported on the second carrier by the respective segments of the releasable bonding material.

Another aspect of the disclosure is a method of releasing at least one micro-LED from a first carrier. The method comprises: a) bonding the at least one micro-LED to the first carrier using a releasable securing layer comprising a release material, wherein the release material debonds when subjected to actinic radiation beyond an exposure threshold; and b) irradiating through the first carrier the releasable securing layer with the actinic radiation having an exposure beyond the exposure threshold to cause the release material to debond and release the at least one micro-LED from the first carrier. In an example of the method, the actinic radiation is scanned over the first carrier using an irradiation system of an irradiation apparatus as described below.

Another aspect of the disclosure is a method of forming a micro-LED carrier structure. The method comprises: measuring at least one operating characteristic of micro-LEDs formed on multiple donor wafers; transferring the micro-LEDs from the multiple donor wafers to respective segmented carriers each comprising an array of carrier segments that can be connected and disconnected from each other; sorting the carrier segments based on the at least one operating characteristic to define sorted carrier segments; and assembling two or more of the sorted segmented carriers based on the at least one measured characteristic to form the micro-LED carrier structure.

Additional features and advantages are set forth in the Detailed Description that follows, and in part will be apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIGS. 5'A through 5'J are cross-sectional views a plurality of micro-LEDs and corresponding structures during various phases of manufacture, illustrating an example process for transfer-printing the micro-LEDs from a donor wafer to a final display backplane.

FIG. 10A is a schematic diagram of an example irradiation system that employs an acousto-optic modulator (AOM) for rapid turn-on and turn-off of the actinic light beam, and orthogonal acousto-optic deflectors (AODs) to rapidly scan the actinic light beam while also moving the general direction of the scanned actinic light beam to account for motion of the micro-LED carrier structure.

FIG. 10B is a close-up view of the incident angle and scan length of the scanned actinic light beam.

FIG. 10C is a close-up cross-sectional view of the scanned actinic light beam showing its elongate shape at the image plane.

DETAILED DESCRIPTION

Figure 1:
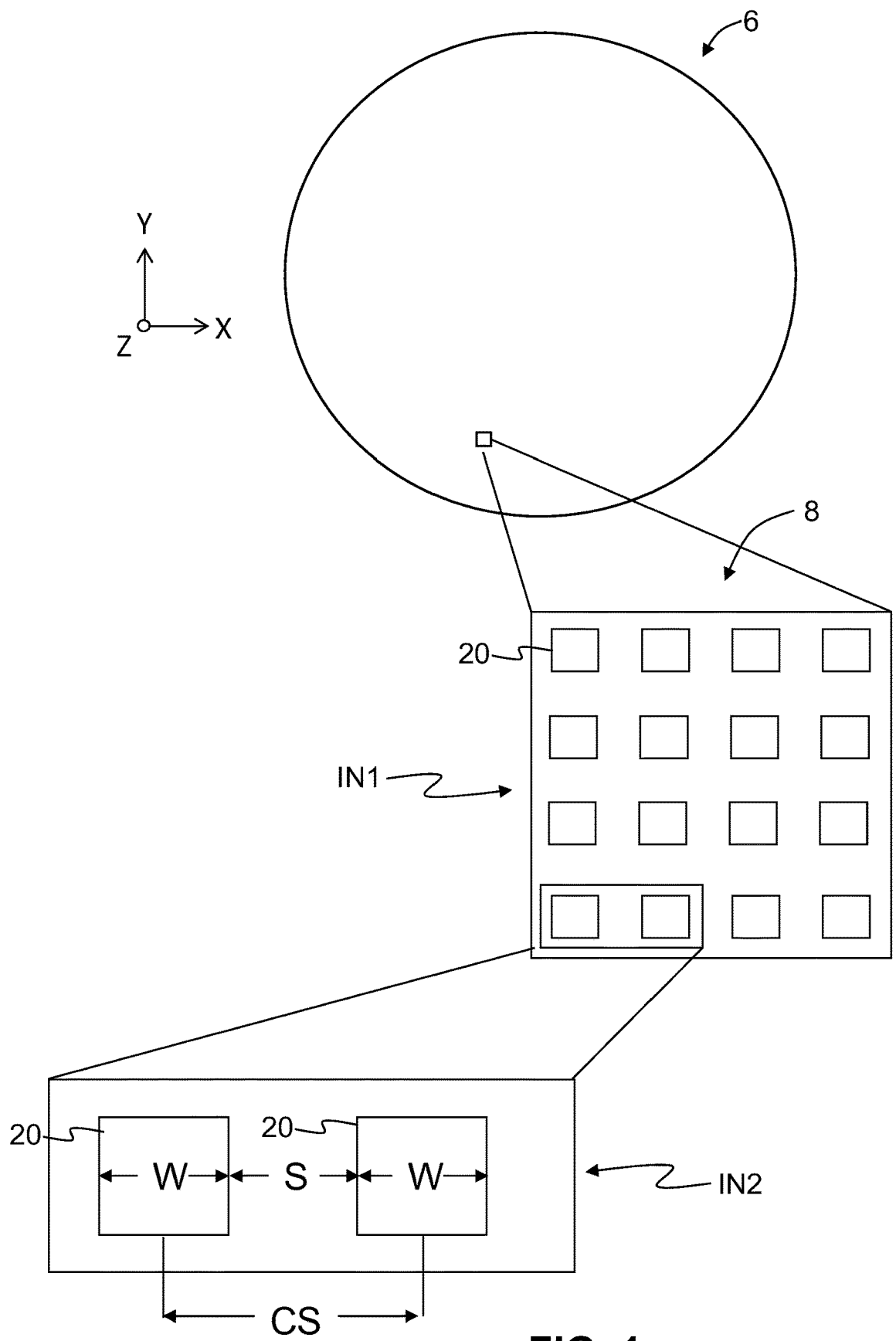
FIG. 1 is a top-down view of an example donor wafer on which is formed an array of micro-LED chips ("micro-LEDs").

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

The initialism "LED" stands for "light-emitting diode."

The initialism "LTPS" stands for "low-temperature poly-silicon."

The initialism "TFT" stands for "thin film transistor."

The initialism "CW" stands for "continuous wave."

The initialism "QCW" stands for "quasi-continuous wave."

The initialism "MOCVD" stands for "metal-organic chemical vapor deposition."

The initialism "MQW" stands for "multiple quantum well."

The initialism "UV" stands for "ultraviolet."

The initialism "CTE" stands for "coefficient of thermal expansion."

The initialism "AOM" stands for "acousto-optic modulator."

The initialism "AOD" stands for "acousto-optic deflector."

The term "carrier" as used herein means a support member used to support one or more micro-LEDs. A display backplane is a type of carrier that includes support features such as bonding pads and conducting paths, which allow the micro-LEDs supported thereon to operate. The terms "first carrier" and "second carrier" are used for convenience of description and are not intended to be limiting as to the type of carrier, and first and second carriers can be identical to each other or different from each other.

A carrier that supports one or more micro-LEDs is referred to herein as a micro-carrier structure.

The terms "LED chip" and "micro-LED" as used herein are synonymous.

The abbreviation "mJ" stands for millijoules.

The term "actinic light" or "actinic light beam" means electromagnetic radiation or an electromagnetic radiation beam that has a wavelength that causes a chemical reaction in a given material, and this wavelength is referred to as the "actinic wavelength" and is denoted $\lambda_a$. The chemical reaction can include ablation. In an example, the actinic wavelength $\lambda_a$ is a UV wavelength, such as 355 nm.

The term "transparent" as used below in reference to a given component (e.g., a carrier) or material means that the given component or material substantially transmits actinic light.

The term "absorbing" as used below in reference to a given component or material means that the given component or material substantially absorbs actinic light.

The term "releasable bonding layer" means a layer of material that can be used to secure one component to another and whose securing property can be either eliminated or sufficiently reduced by exposure to (i.e., irradiation by) actinic light beyond a threshold exposure. This exposure reduces or eliminates the bond between the two components to the point where one component becomes separated from the other. The type of bond created by the releasable bonding layer is referred to herein as a "releasable bond," and the process of releasing the bond by sufficient exposure to actinic light (i.e., beyond the threshold exposure) is referred to herein as "debonding." In the discussion below, the releasable bonding layer need not be continuous and in an example can be formed using spaced apart portions, i.e., releasable bonding segments, or just "segments" for short. In the discussion below, a single segment can constitute a layer, and in a particular example can be considered a relatively "short" layer compared to the size of the surface upon with the segment resides.

Cartesian coordinates are shown in some of the Figures for reference and ease of discussion and are not intended to be limiting as to direction and orientation.

First Example Method

FIG. 1 is a top-down view of an example micro-LED donor wafer 6 on which is formed an array 8 of micro-LED chips ("micro-LEDs") 20. The micro-LED donor wafer ("donor wafer") 6 typically includes many thousands of micro-LEDs 20 and an example can be any size conventionally used in LED fabrication, e.g., 100 mm to 300 mm in diameter. In an example best seen in the two close-up insets IN1 and IN2 of FIG. 1, the micro-LEDs 20 are square and have a size (width W) with an edge-to-edge spacing between adjacent micro-LEDs of S=W and a center-to-center spacing CS=2S=2 W. In an example, the width W is in the range from 3 μm to 50 μm. The micro-LEDs 20 on a given donor wafer have the same emission wavelength, which in an example can be red (R), green (G) or blue (B).

A given micro-LED 20 can be any color (i.e., have any emission wavelength) commonly associated with micro-LEDs, such as R, G or B, unless otherwise stated. The micro-LEDs 20 need not be square and can be rectangular, round, or any other shape. The spacing between the micro-LEDs 20 and the width of the chips are typically different, although S=W for simplicity in the drawings. A rectangular shape is typically used for lateral LEDs, with p and n side contacts on the same side of the wafer and where the current between the contacts is largely in the plane of the LED. Square or rounded shapes are typically used for vertical LEDs where the current between the contacts is largely in the vertical plane.

The transfer methods described herein are equally applicable to the different types of micro-LEDs. The donor wafers on which the micro-LEDs (LED chips) are formed are typically either sapphire or Si <111> for GaN-based LED chips and GaAs for AsP-based LED chips. GaN-based LED chips are typically used for blue and green, while red chips are typically AsP based. Some displays use all blue chips with color conversion to red, green or white in conjunction with a color filter. Color conversion is achieved by passing the emitted light through a color conversion phosphor. A variety of rare earth, quantum dot and perovskite phosphors are available for color conversion. Thus, although a RGB display has been used as an example, the methods described are equally applicable to an all blue display backplane. Also, although the LED chips for each of the colors are shown to be similarly sized for ease of illustration, in practice they have different sizes and shapes.

There are a number of different ways to form the donor wafer 6. FIGS. 2A through 2E are close-up X-Y cross-sectional views of a portion of the micro-LED donor wafer 6 illustrating initial steps in an example method of forming the array 8 of micro-LEDs 20 on the donor wafer. In this first example method, the details of the fabrication of the micro-LEDs 20 are discussed for the sake of completeness. However, the methods disclosed herein are not limited to a particular configuration of the individual micro-LEDs 20.

Figure 2A:
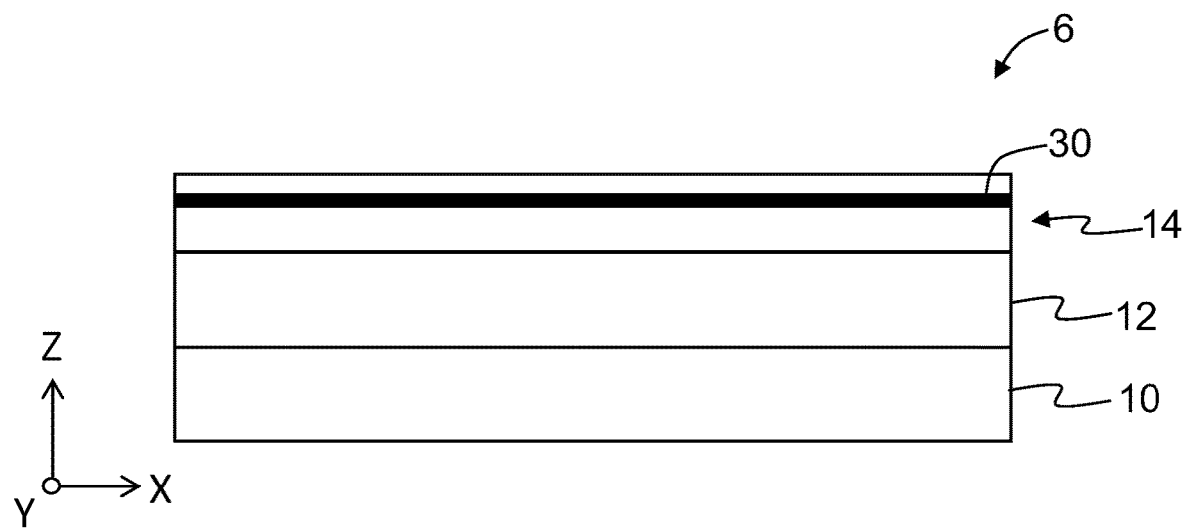
FIGS. 2A through 2E are close-up X-Z cross-sectional views of a portion of the donor wafer of FIG. 1, illustrating initial steps in an example method of forming the array of micro-LEDs on the donor wafer.

With reference first to FIG. 2A, the donor wafer 6 comprises a growth substrate 10 and an epitaxial layer 12. In one example, the growth substrate 10 can be made of sapphire and the epitaxial layer 12 made of silicon (Si) for blue-emitting or green-emitting micro-LEDs 20. In another example, the growth substrate 10 can be made of germanium (Ge) and an epitaxial layer 12 made of a gallium-arsenide (GaAs) layer for red-emitting micro-LEDs 20. In an example method of forming micro-LEDs 20, the epitaxial layer 12 is used to form an epitaxial stack 14 that includes a MQW structure 30 as is known in the art.

Figure 2B:
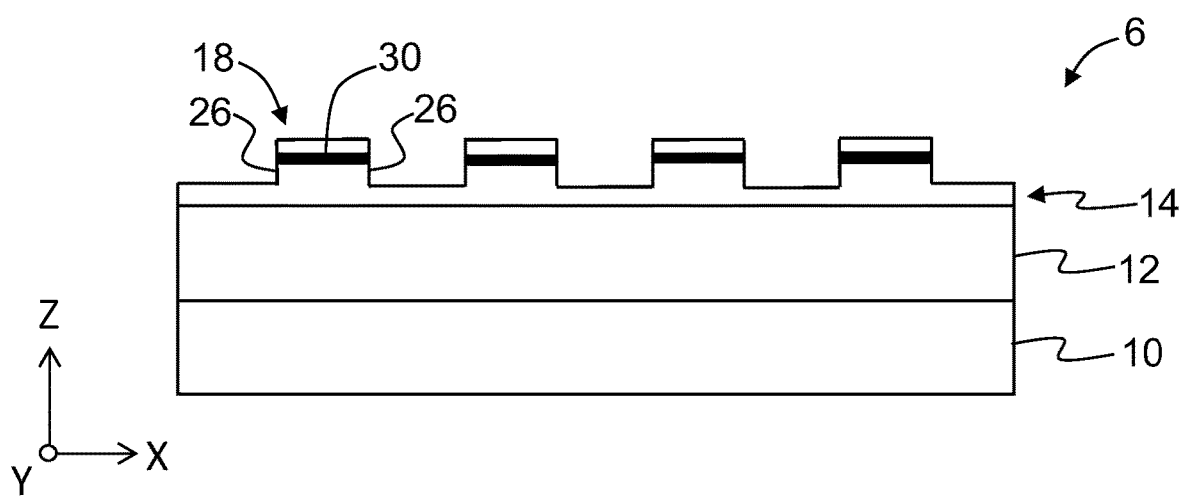

With reference now to FIG. 2B, the epitaxial stack 14 is then etched to define individual micro-LED structures ("structures") 18 used to form the final micro-LEDs 20. The vertical structure is called a "mesa". Each of the structures 18 includes sidewalls 26 and a section of the MQW structure 30. After etching, the sidewalls 26 are rough and require processing. This processing can include a cleaning step and a passivation step. Methods for sidewall cleaning and passivation are known in the art to reduce edge losses in III-V lasers and solar cells, and these sidewall cleaning methods can be adapted for the methods of fabricating the micro-LEDs 20.

In an example, the surface cleaning step can include providing a cleaning gas (e.g. in $Cl_2$, HCl, $CCl_4$ or other Cl containing gases) at an elevated temperature (e.g., in the range from 500-800° C.). This can be followed by a wet clean to remove the resulting chlorinated surface and by a passivation of the sidewall, e.g., using ammonium sulfide or tri-octyl-phosphine sulfide.

Figure 2C:
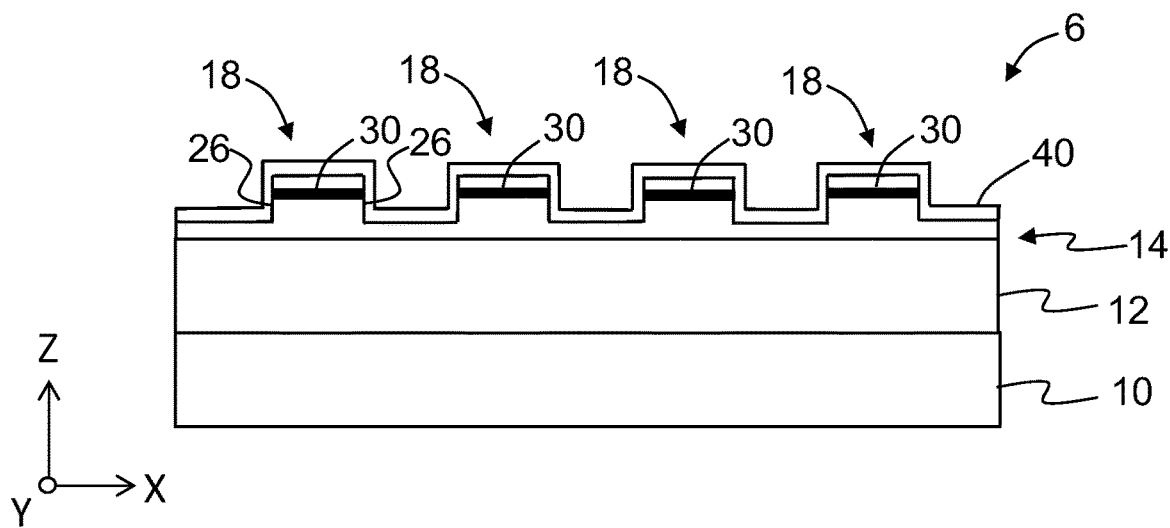

Also in an example, the passivation step includes re-growing an epitaxial layer 40 on the sidewalls 26, as shown in FIG. 2C. This reduces the recombination of electrons and holes along the sidewalls 26. If the sidewalls 26 are left bare and untreated, the loss of electrons and holes increases dramatically, and the internal quantum efficiency (IQE) of the micro-LEDs 20 drops to <10% of the IQE achievable for large (>100 μm) micro-LED chips.

Ideally, the carriers should recombine radiatively thereby emitting light. If the sidewalls 26 are cleaned and passivated, the surface recombination velocity is reduced from >$10^6$ cm/s to the range $10^4$-$10^5$ cm/s. Simulations indicate that with this level of reduction in surface recombination velocity, the IQE can be >25% of the IQE achievable for large (>100 μm) chips. The simulations also show that increasing the current improves the IQE since this increases the carrier concentration and hence the radiative recombination which scales as $n^2$, where n is the effective carrier concentration. However, an injection current of 20 μA may be the practical upper limit for LTPS-based TFTs on the backplane of a smartphone. Limiting the electrical contact to the center of the micro-LED 20 also helps limit the carrier loss to the sidewalls 26. Diffusion, and hence loss of carriers to the sidewalls 26, can also be reduced by shortening the mean free path of the carriers in the MQW 30. The mean free path can be shortened by adding scattering centers. Scattering centers however can also serve as recombination centers and can be undesirable. Thus, scattering centers that do not serve as recombination centers have to be created. Methods such as coulombic scattering by doping the barriers surrounding the quantum well or phonon scattering by cladding the MQW structure by an oxide (e.g. $HfO_2$) can be used to form the appropriate type of scattering centers.

Once the sidewalls 26 are cleaned and passivated, then with reference to FIG. 2C, an epitaxial layer 40 can then be formed (regrown) on the structure of FIG. 2B using for example an MOCVD process.

Figure 2D:
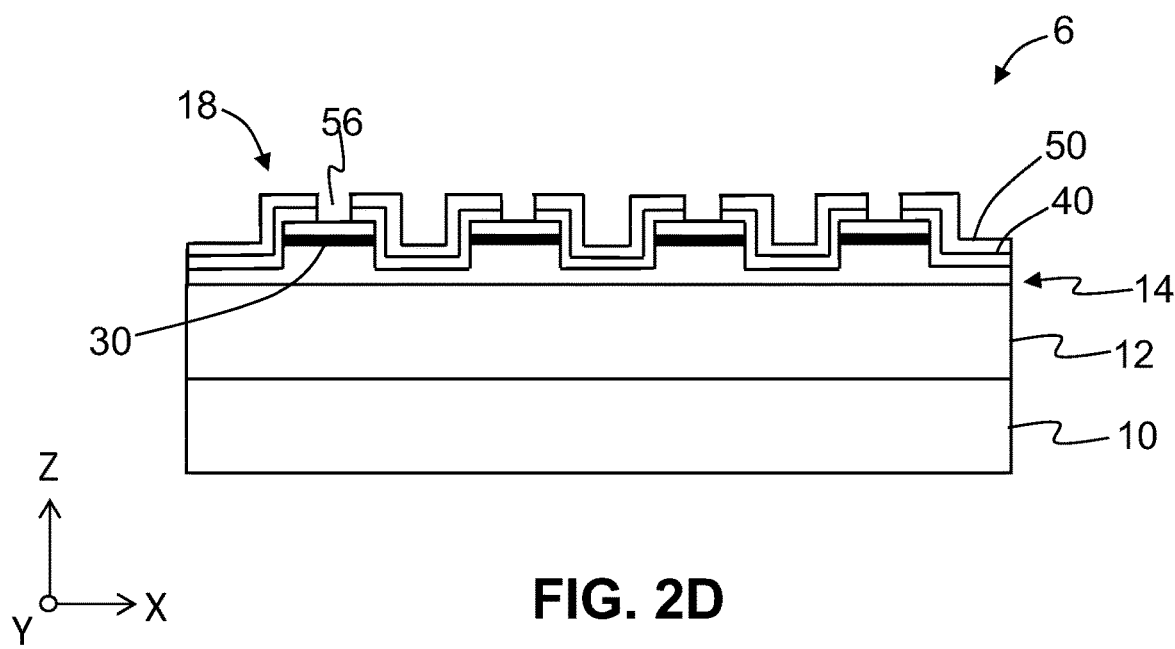

With reference now to FIG. 2D, the example method further includes depositing an encapsulation layer 50 over the epitaxial layer 40 and then etching vias 56 (only one labeled for convenience) in the encapsulation layer and the epitaxial layer 40 at the location of each micro-LED 20. In an example the vias 56 are formed substantially at the centers of the micro-LEDs 20 as shown. Each via 56 may have to penetrate epitaxial layer 40 if electrical contact has to be made directly to the underlying layers.

Figure 2E:
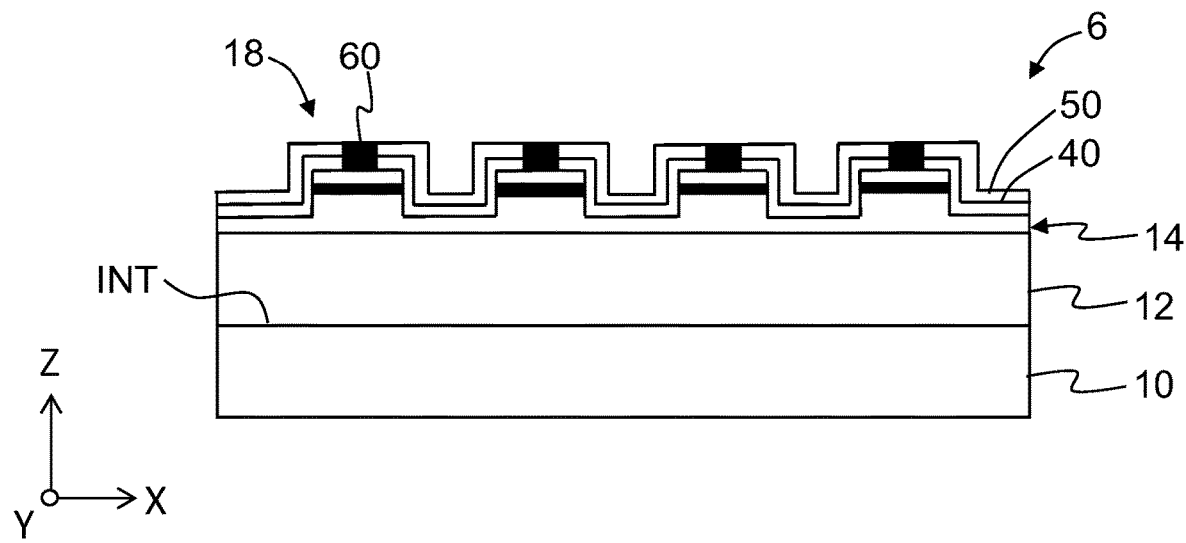

With reference to FIG. 2E, the example method further includes depositing a metal inside each via 56 and annealing the metal to form contacts (e.g., p-contacts) 60 (only one labeled for convenience) for each micro-LED 20. At this point in the process, the donor wafer 6 includes the basic structures 18 that are used to form the individual micro-LEDs 20. It is noted that other forms of the basic structures 18 can be employed. For example, the contacts 60 can be pillar-type contacts formed adjacent the main epitaxial stack 14. The process flow has been described with respect to a vertical LED chip. The lateral LED chip process flow is very similar except that another contact is made to the epitaxial layer adjacent to the etched mesa. In this case, there will be two contacts 60 for each LED chip. The metals for each of these contacts is typically deposited and annealed separately since the metals and annealing conditions for the p and n side contacts are different.

Figure 3A:
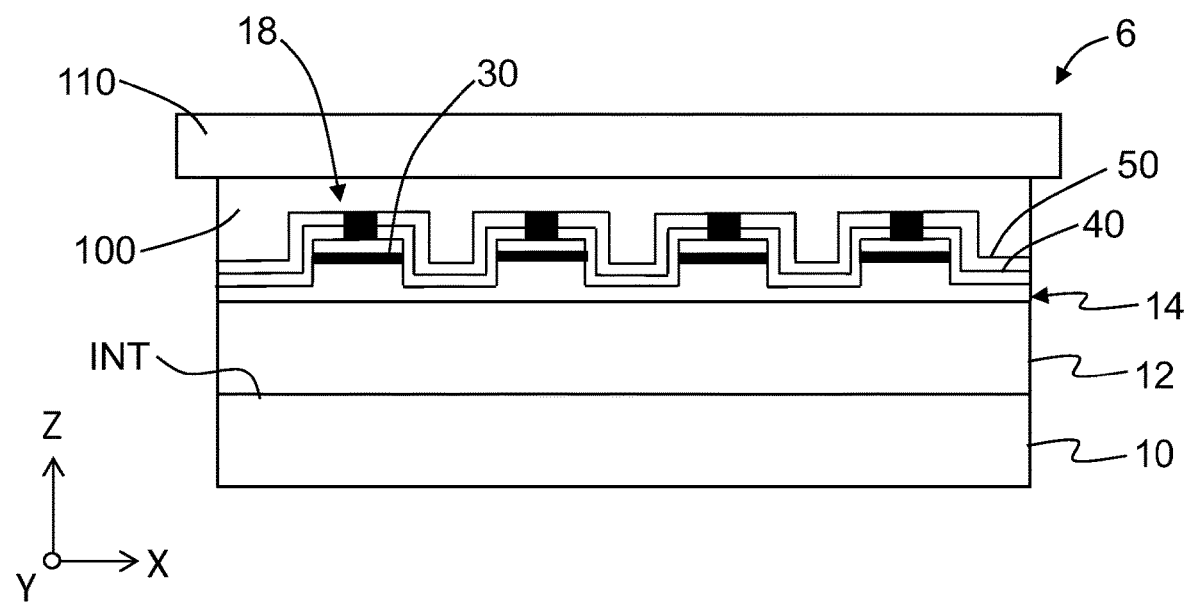
FIGS. 3A through 3D are close-up X-Z cross-sectional views showing an example of how the donor wafer of FIG. 2E and the micro-LEDs thereon are processed to form a lifted-off structure.

In the next steps of the example method, the structures 18 of the donor wafer 6 are singulated into the micro-LEDs 20 and incorporated into a placement structure used to transfer the micro-LEDs onto a display backplane to form a micro-LED display. This can be accomplished in part by using a mechanical lift-off (MLO) operation. With reference now to FIG. 3A, a stressor layer ("stressor") 100 is deposited over the structures 18, i.e., over the encapsulation layer 50. A lift-off handle 110 is then attached to the stressor 100 as shown. The stressor 100 creates a high stress at an interface INT between the epitaxial layer 12 and the growth substrate 10. This results in the formation of a crack that creates a cleave plane which propagates along the interface INT, thereby separating the growth substrate 10 from the epitaxial layer 12 and forming a lifted-off structure 120 as shown in FIG. 3B.

Since the cleave plane propagates at the interface INT between the growth substrate 10 and the epitaxial layer 12, both resulting surfaces remain atomically smooth so that the growth substrate 10 can be reused to form another array 8 of micro-LEDs 20. This ability to re-use the growth substrate 10 many times (e.g. ≥10 times), reduces fabrication costs and also makes it practical to use 200 mm sapphire and germanium substrates, which are relatively expensive. An added advantage of using an MLO operation is that micro-cracking, which is an undesirable but common occurrence in other lift-off techniques such as laser lift-off and chemical lift-off, is avoided. Conventional layer transfer methods such as laser lift-off and chemical lift-off can be used instead of mechanical lift-off as described below.

Figure 3B:
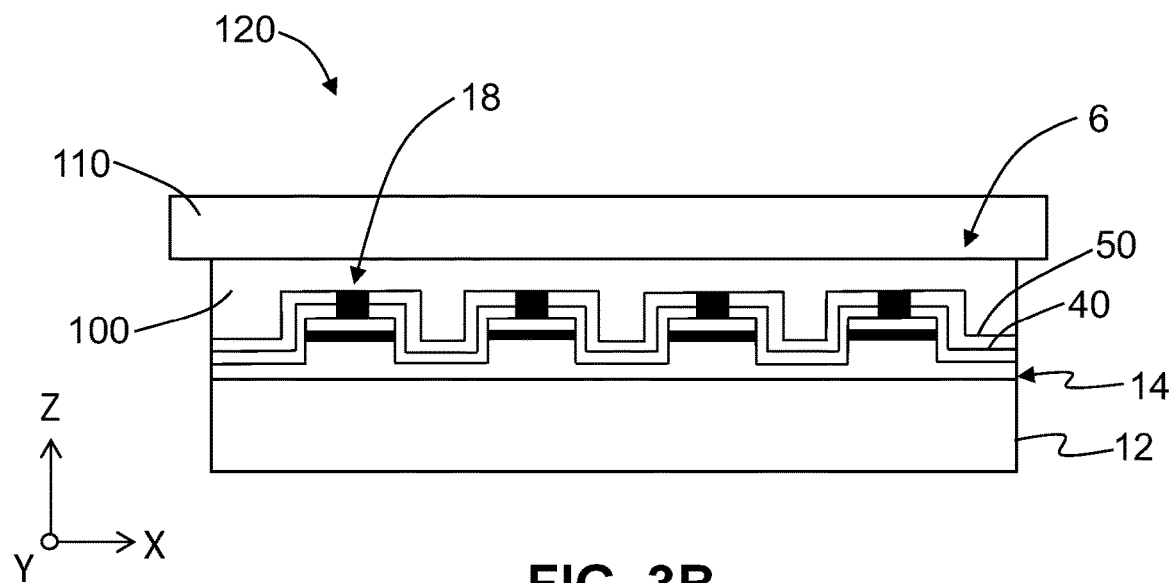
Figure 3C:
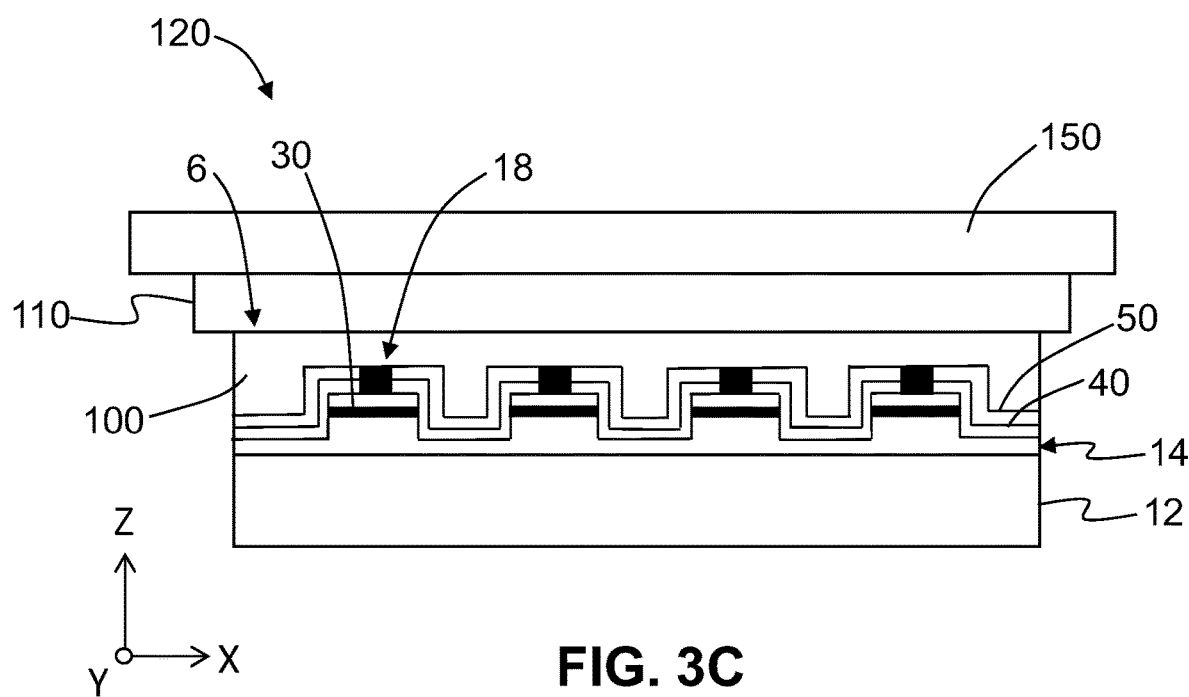
Figure 3D:
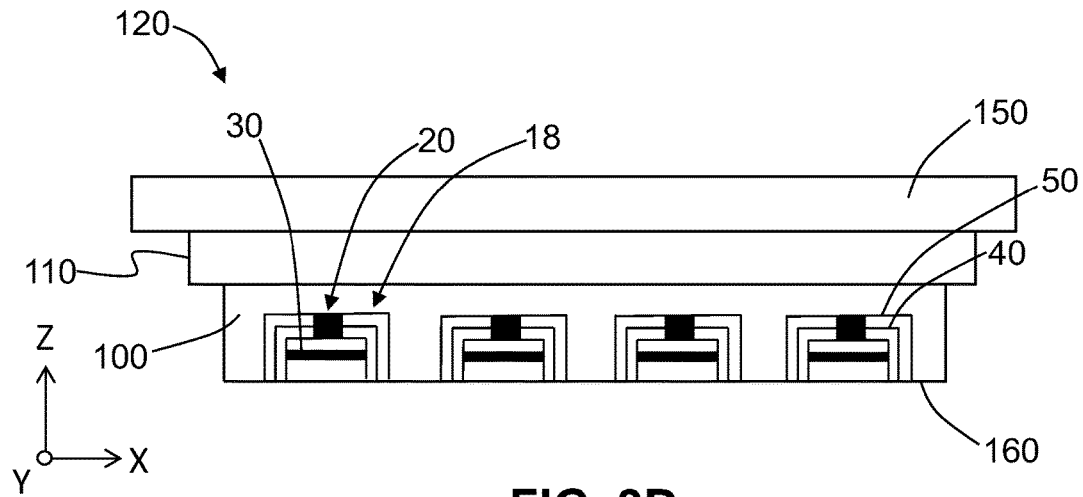

FIG. 3C is similar to FIG. 3B and shows the addition of a tape frame 150 to the lift-off handle 110 of the lifted-off structure 120 of FIG. 3B. FIG. 3D is similar to FIG. 3C and shows the removal of the exposed epitaxial layer 12 as well as a portion of the epitaxial stack 14 and the portion of the encapsulation layer 50 that resides between the structures 18 to define the micro-LEDs 20, which are now all separated from each other, i.e., they are singulated but held in place by stressor 100. The lifted-off structure 120 now has a surface 160 at which the micro-LEDs 20 reside.

Figure 3E:
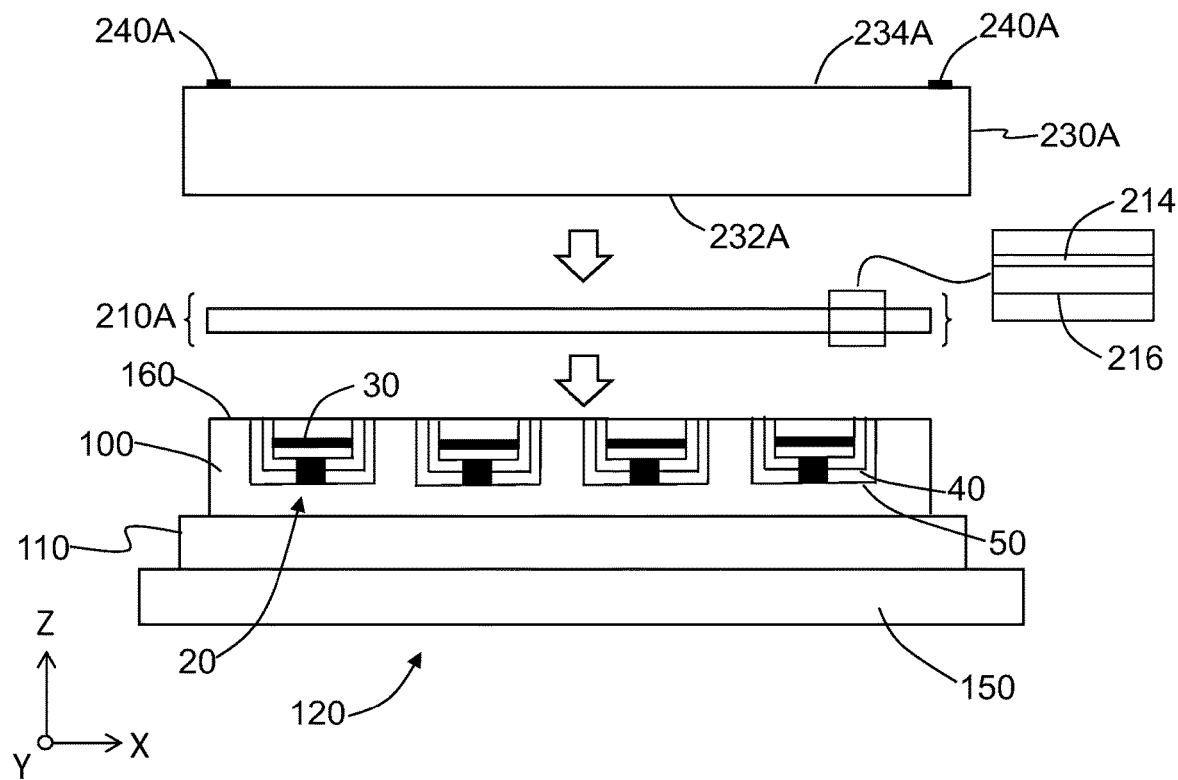
FIGS. 3E through 3G are close-up X-Z cross-sectional views showing an example of how the lifted-off structure of FIG. 3E is further processed to form a micro-LED carrier structure.

With reference now to the partially exploded close-up side view of FIG. 3E, the lifted-off structure 120 of FIG. 3D may be turned over so that the surface 160 is facing upward. A first carrier 230A is also shown in FIG. 3E opposite the surface 160. The first carrier 230A has a surface 232A that faces the surface 160 of the lifted-off structure 120 and also has an opposite surface 234A. In an example, the first carrier 230A is made of a material substantially transparent to UV light, such as glass (e.g., fused silica (quartz)) or sapphire. The first carrier 230A can be relatively thin, e.g., 0.5 mm to 2 mm.

Figure 3F:
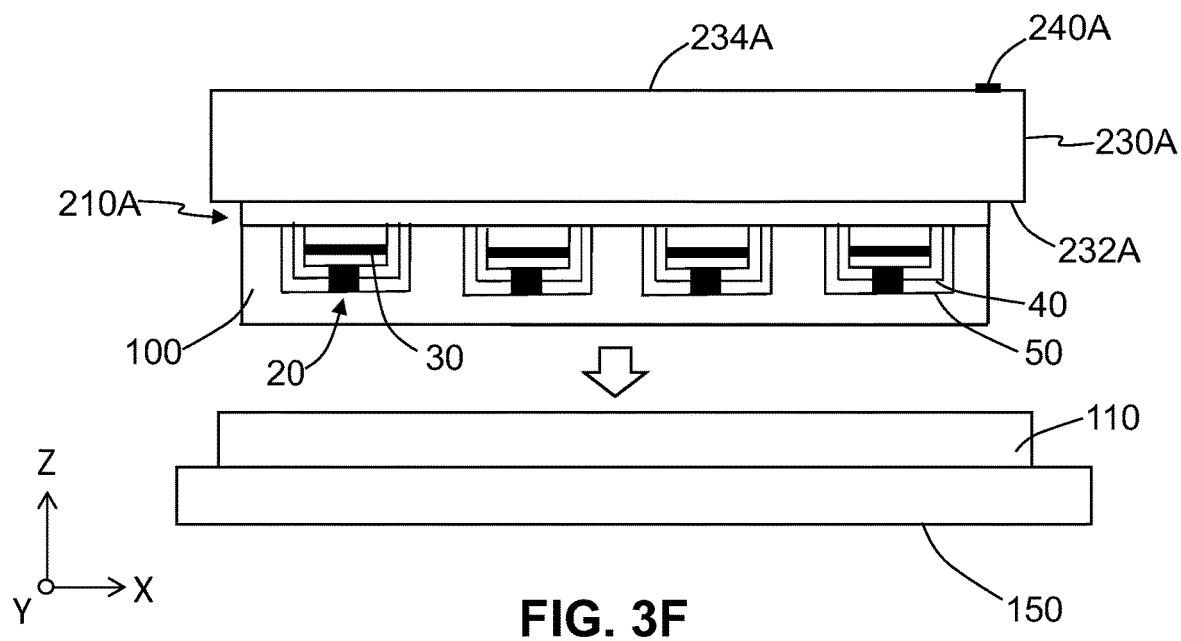

A first releasable bonding layer 210A resides between the surface 160 of the lifted-off structure 120 and the carrier surface 232A and is used to secure the lifted-off structure to the first carrier 230A, as shown in the assembled view of FIG. 3F.

In an example, the first releasable bonding layer 210A comprises a release material 214 and an adhesive material 216. The release material 214 resides immediately adjacent the carrier surface 232A and can be applied thereon using a variety of methods, such as spin coating, slit coating, dip coating, ink-jet coating, etc. In an example, the adhesive material 216 can be added to the surface 160 of the lifted-off structure 120. The adhesive material 216 is substantially transparent and in an example is thicker than the release material 214. The adhesive material 216 can serve as a compliant layer to account for wafer bow/warp and variations in planarity across the surface 160. Such surface variations originate from the donor wafer 6. Thus, in an example, the adhesive material 216 initially resides in contact with the micro-LEDs 20 while the release material 214 initially resides atop the adhesive material opposite the micro-LEDs.

Materials generally suitable for the release material 214 include: polyimide (PI), polybenzoxazole (PBO), benzocyclobutene (BCB) and epoxy, among others. Of these, the non-photo-definable PI can have the lowest CTE and lowest costs and is well suited for use with UV light. One example of an adhesive material 216 with high temperature stability and suitable for use with excimer lasers is a PI adhesive, such as HD-3007, available from HD MicroSystems. In some examples, one or more of first releasable bonding layer 210A, second patterned releasable bonding layer 210B, and releasable bonding layers of other embodiments disclosed herein and/or made in accordance with the present disclosure may comprise just a release material or just an adhesive instead of a layered combination of a release material and adhesive material as shown in FIG. 3E.

In an example, the first carrier 230A includes first alignment marks 240A on the surface 234A. The alignment marks 240A can be any type of suitable indicia such as fiducials for performing optical alignment as discussed below. The alignment marks 240A reside at a known position relative to the micro-LEDs 20 and so serve a reference location, as described below.

Figure 3G:
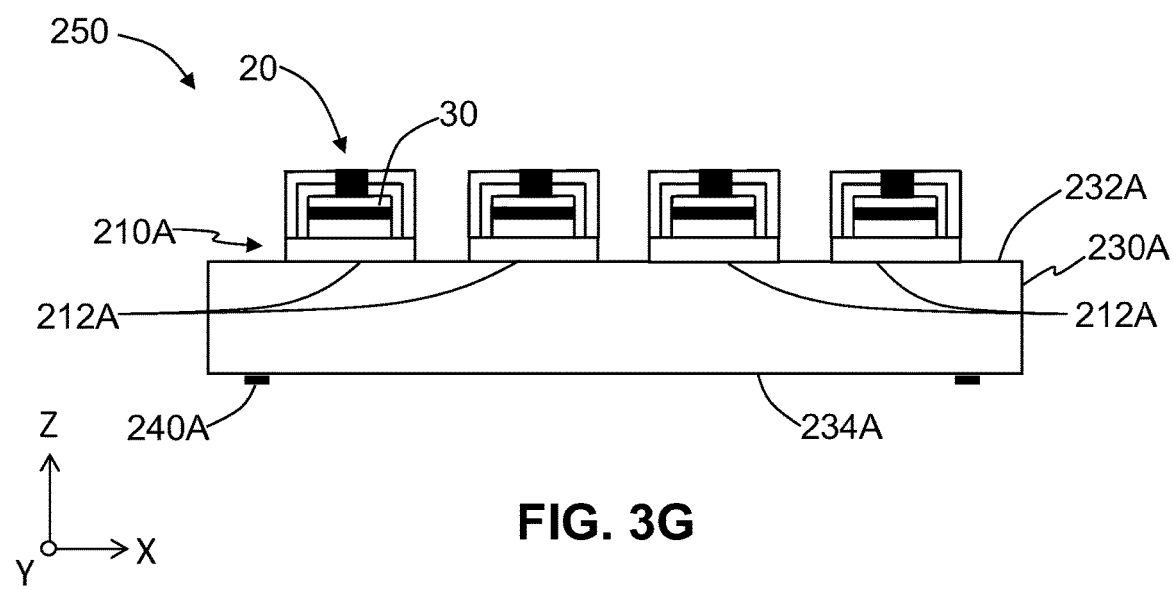

At this point, the tape frame 150 and lift-off handle 110 can be removed, as shown in FIG. 3F. Then, as shown in FIG. 3G, the stressor 100 can be removed, e.g., by chemical or electro-chemical etching. In addition, the portions of the first releasable securing layer 210A that reside between the micro-LEDs 20 are removed, e.g., by dry etching, plasma ashing (e.g. in an atomic oxygen and atomic fluorine containing environment), by dissolution by a solvent jet or by ablation with a laser or fluid (e.g. water, $CO_2$ snow) jet. The result is a micro-LED carrier structure 250 as shown in FIG. 3G, which is shown flipped over from the orientation in FIG. 3F for convenience. Note that the first releasable bonding layer 210A is patterned, i.e., it now comprises segments 212A that reside on the surface 232A of the first carrier 230A and correspond to the locations of each micro-LED 20.

Figure 3H:
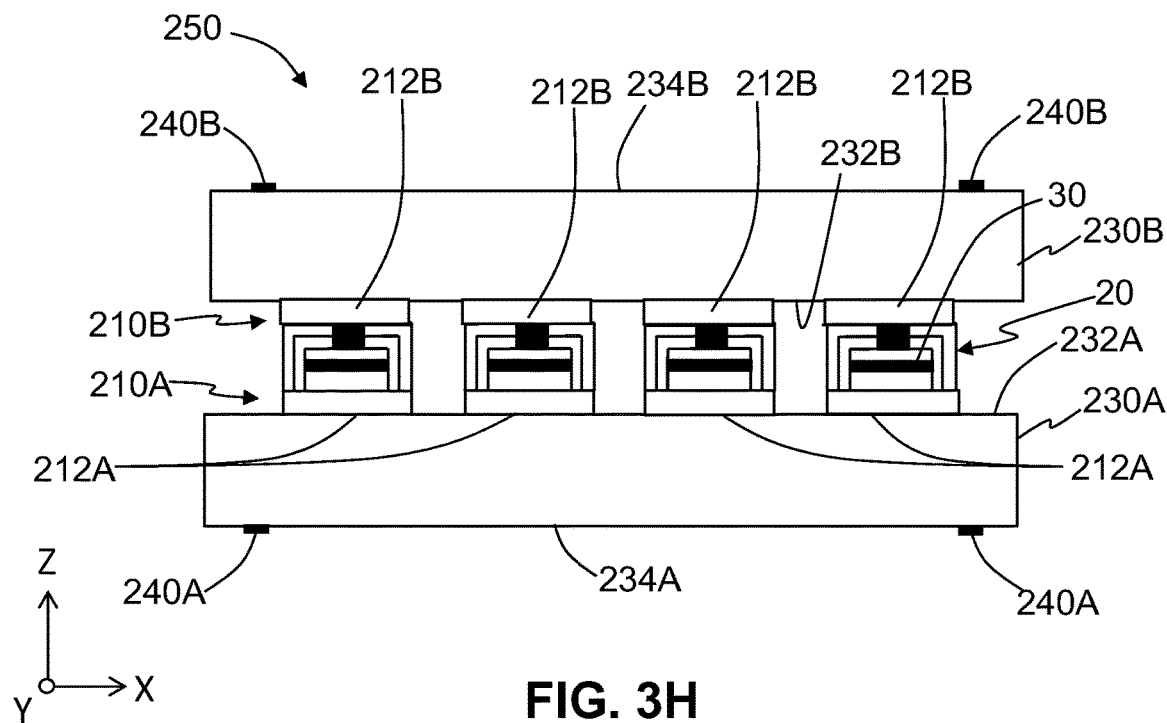
FIG. 3H is a close-up X-Z cross-sectional view of the micro-LED carrier structure of FIG. 3G but also including a second carrier.

FIG. 3H shows the micro-LED carrier structure 250 of FIG. 3G as well as a second carrier 230B having opposite surfaces 232B and 234B, with the latter surface having alignment marks 240B similar, if not identical, to the alignment marks 240A of the first carrier 230A. The second carrier 230B can be the same as or similar to the first carrier 230A.

Figure 3I:
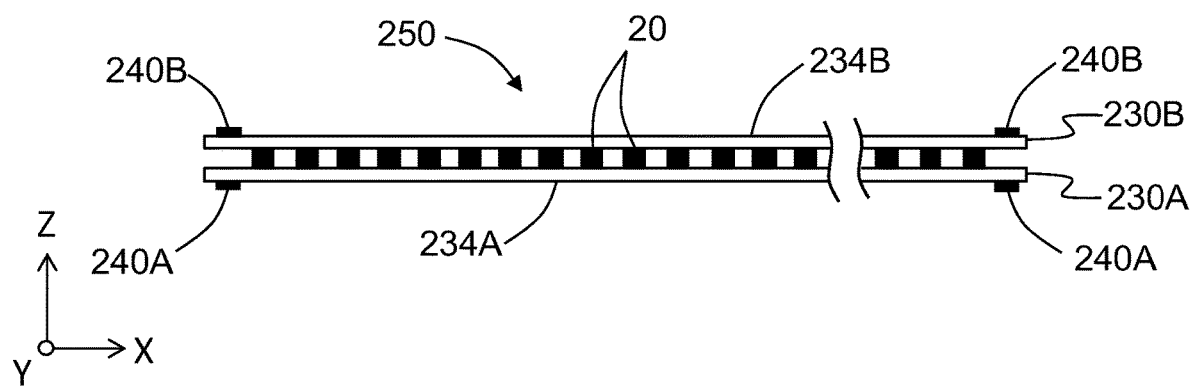
FIG. 3I is a wide-angle side view of the example micro-LED carrier structure of FIG. 3H.

The surface 232B supports a second patterned releasable bonding layer 210B the same as or similar to the first releasable bonding layer 210A and defined by segments 212B that align with the micro-LEDs 20. The patterning of the second releasable bonding layer 210B to form the segments 212B can be carried out using conventional patterning methods, such as imprint lithography. Thus, in the micro-LED carrier structure 250 of FIG. 3H, the first carrier 230A and the second carrier 230B sandwich the micro-LEDs 20 between respective segments 212A and 212B, with the first and second carrier surfaces 232A and 232B facing each other. FIG. 3I is a wide-angle side view of the micro-LED carrier structure 250. The relative scale of the micro-LEDs 20 is enlarged and the segments 212A and 212B that releasably secure the micro-LEDs to the respective first and second carriers 230A and 230B are omitted in FIG. 3I for ease of illustration.

Figure 3J:
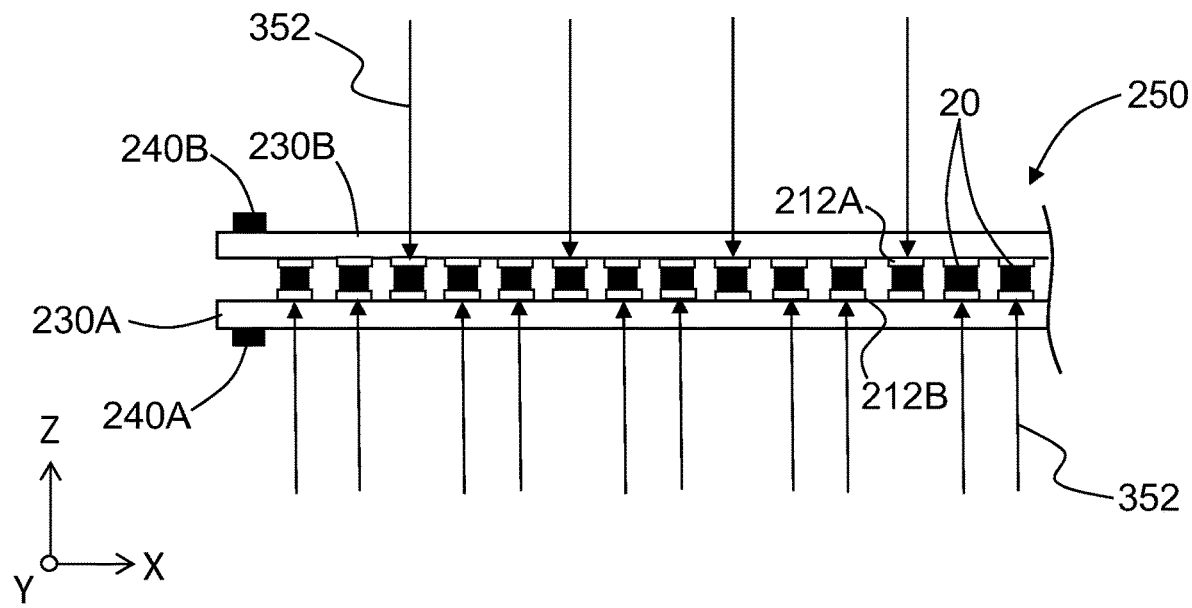
FIG. 3J is a close-up X-Z cross-sectional view of the example micro-LED carrier structure of FIGS. 3H and 3I illustrating an example of how actinic light is used in a light-based debonding process to selectively irradiate the micro-LED carrier structure to cause the release of select micro-LEDs from either the first (bottom) carrier or the second (top) carrier.

The next step in the method includes selectively releasing the micro-LEDs 20 so that they can be placed onto a display backplane. This releasing step includes first selectively irradiating the segments 212A and 212B with an actinic light beam 352, as shown in FIG. 3J. This process can be carried out in an irradiation apparatus, examples of which are described in greater detail below. In an example, the actinic light beam 352 provides between 100 $mJ/cm^2$ to 200 $mJ/cm^2$ to the given segment 212A or 212B being irradiated.

Figure 3K:
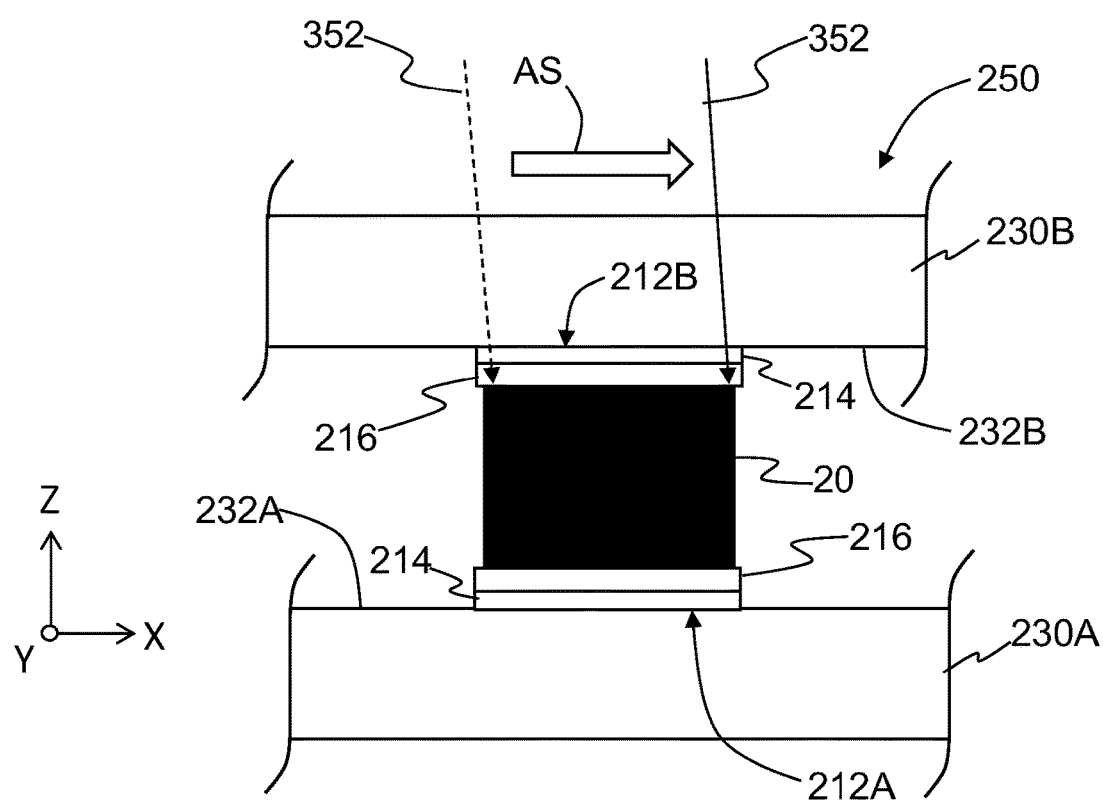
FIG. 3K is a close-up X-Z view of the micro-LED carrier structure of FIG. 3J illustrating an example of the light-based debonding process wherein the actinic light beam is scanned over the releasable securing layer that holds the micro-LED to the second (top) carrier.
Figure 3L:
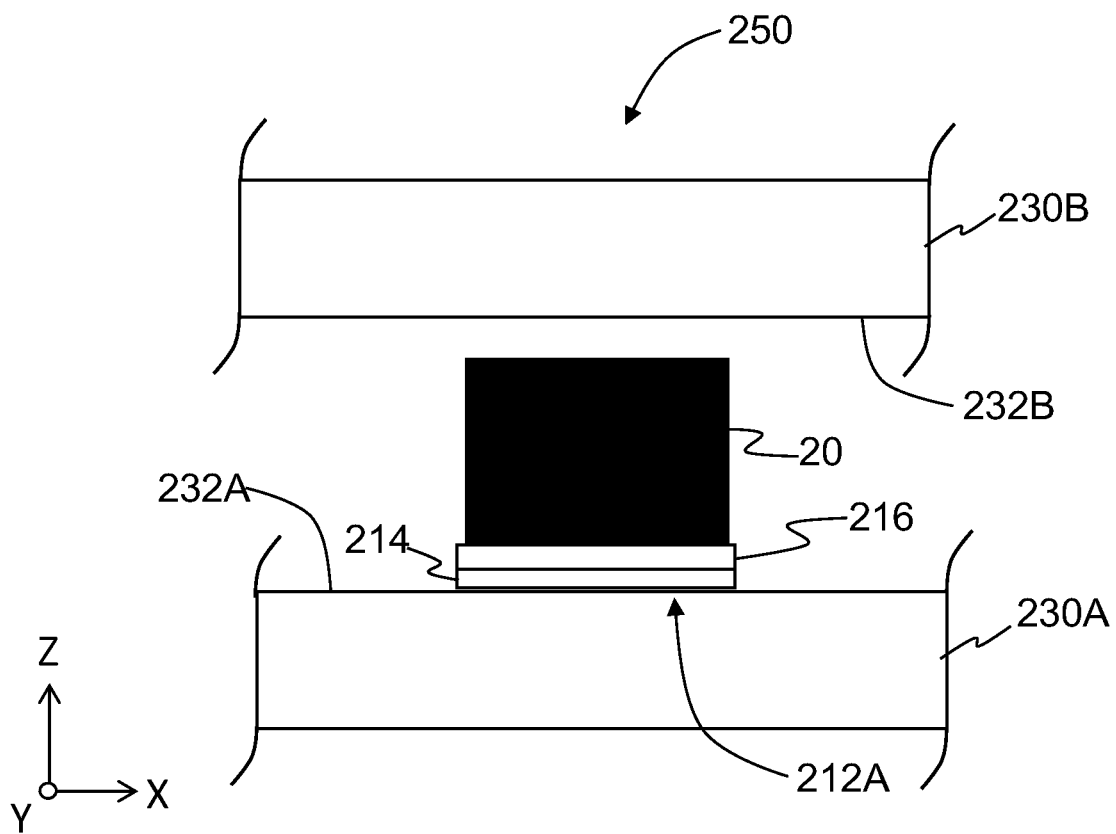
FIG. 3L is similar to FIG. 3K and shows the removal of the releasable securing layer by the scanned actinic light beam so that the micro-LED is released from the second (top) carrier while still being attached to the first (bottom) carrier.

FIG. 3K is a close-up view of one of the micro-LEDs 20 in the micro-LED carrier structure 250. The actinic light beam 352 travels through the second (top) carrier 230B to the segment 212B. The actinic light beam 352 is shown being scanned over the width of the segment 212B. The actinic light beam 352 irradiates the segment 212B causing a chemical change in the release material 214 of the segment, thereby causing the segment to lose its securing (bonding) capacity and separate from the second carrier 230B, as shown in FIG. 3L. Said differently, irradiation of the release material 214 of segment 212B results in debonding of the micro-LED from the second carrier 230B. This process is referred to as the light-based debonding process.

In an example, most or all of the segment 212B is ablated, and further in the example both the release material 214 and the adhesive 216 is ablated.

At this point, the micro-LED 20 is now only attached to the first (lower) carrier 230A, as shown in FIG. 3L by the segment 212A.

The light-based debonding process is carried out through both sides of the micro-LED carrier structure 250, as illustrated schematically in FIG. 3J. As described below, the light-based debonding process can be carried out sequentially through one of the first and second carriers 230A and 230B and then the other. In another example, the light-based debonding process can be carried out simultaneously through the first and second carriers 230A and 230B.

Figure 3M:
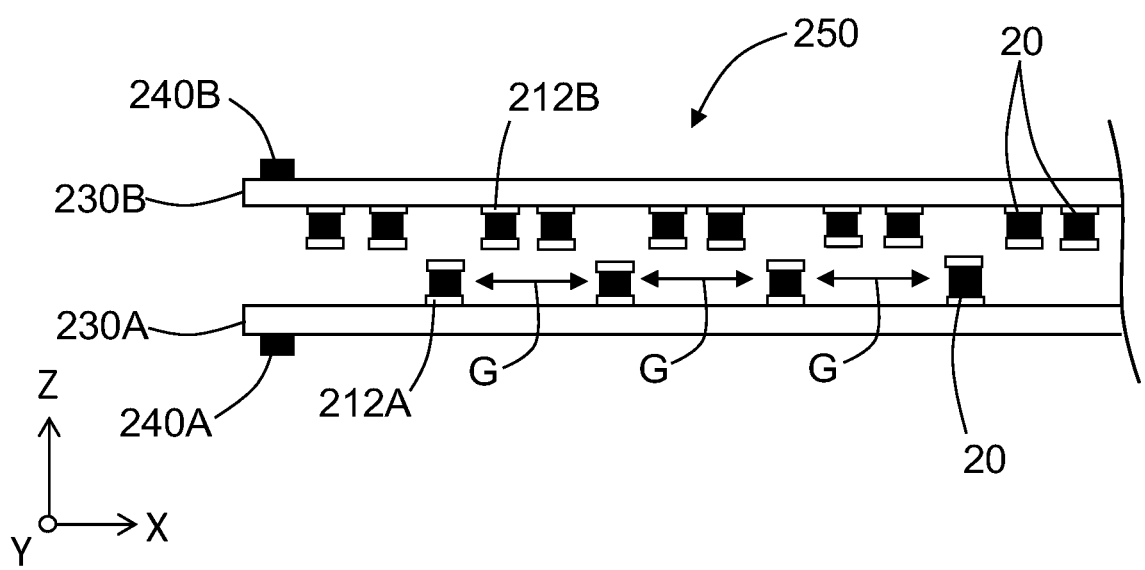
FIG. 3M is similar to FIG. 3J and shows the first and second carriers as separated due to carrying out the light-based debonding process on the micro-LEDs held by the micro-LED carrier structure.

The light-based debonding process, when completed, allows for the first and second carriers 230A and 230B to be separated, as shown in FIG. 3M. The first carrier 230A carries (supports) a first set of the micro-LEDs 20 and the second carrier carries (supports) a second set of the micro-LEDs.

In various examples, any number of the micro-LEDs 20 in the micro-LED carrier structure 250 (including none) can be selected to be carried by the first carrier 230A or the second carrier 230B. Likewise, a select pattern of the micro-LEDs 20 can be employed that facilitates the downstream step of transferring the micro-LEDs 20 to a display backplane, as described below.

Figure 4A:
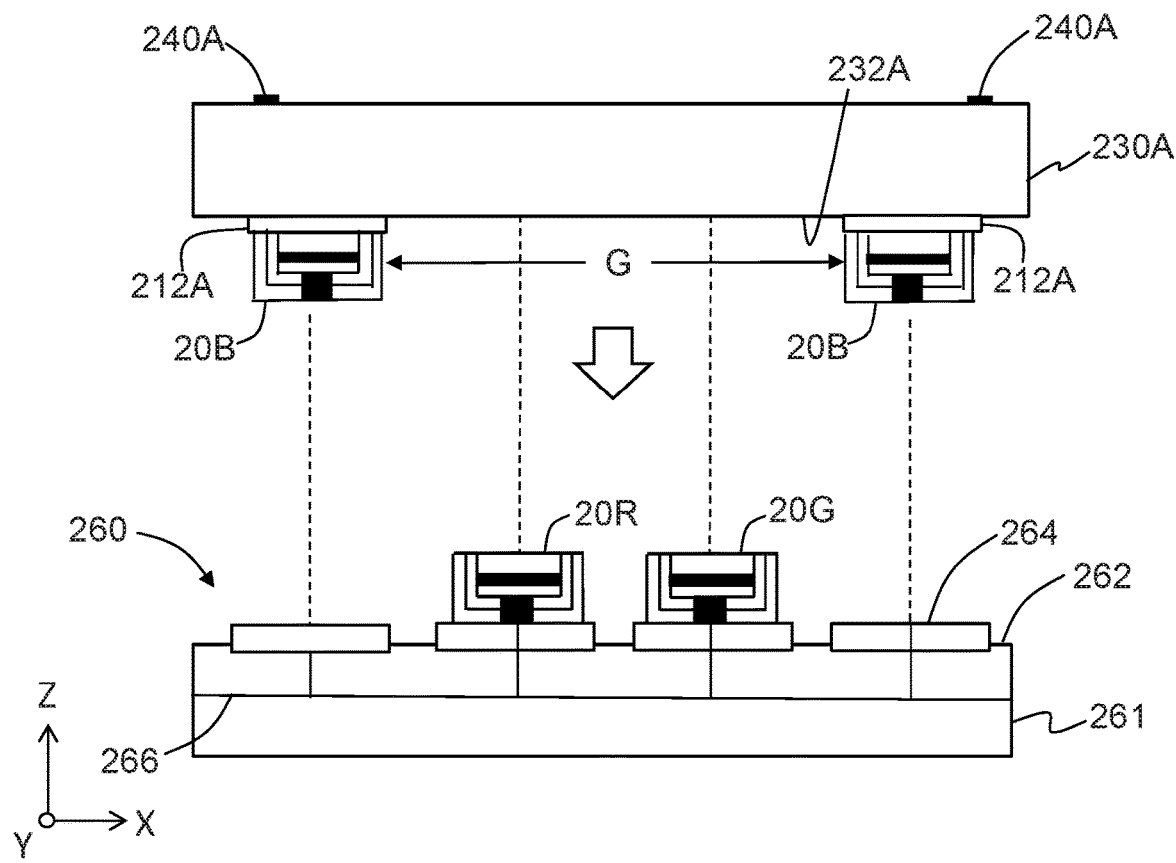
FIGS. 4A through 4C are close-up X-Z cross-sectional views of a portion of the first carrier and a portion of a display backplane, illustrating an example of transferring the micro-LEDs from the first carrier to the display backplane using another application of the light-based debonding process.

For example, with continuing reference to FIG. 3M and to the close up cross-sectional view of FIG. 4A, the first carrier 230A from FIG. 3M now carries micro-LEDs 20 that are spaced apart by gaps G that otherwise would include two micro-LEDs 20. The two micro-LEDs 20 come from the same donor wafer 6 and so have the same emission wavelength, which for example is blue, so that the two micro-LEDs in FIG. 4A are identified as 20B. FIG. 4A also shows a portion of a display backplane 260. The display backplane 260 includes a backplane substrate 261 having a mounting surface 262 that includes micro-LED bonding pads 264. Four example bonding pads 264 are shown, along with conductive paths 266 that provide electrical connections to the bonding pads and to the micro-LEDs 20 when operably mounted thereon. The conductive paths 266 are shown schematically as residing within the body of the display backplane 260, but the conductive paths in practice can reside on the mounting surface 262.

Figure 4B:
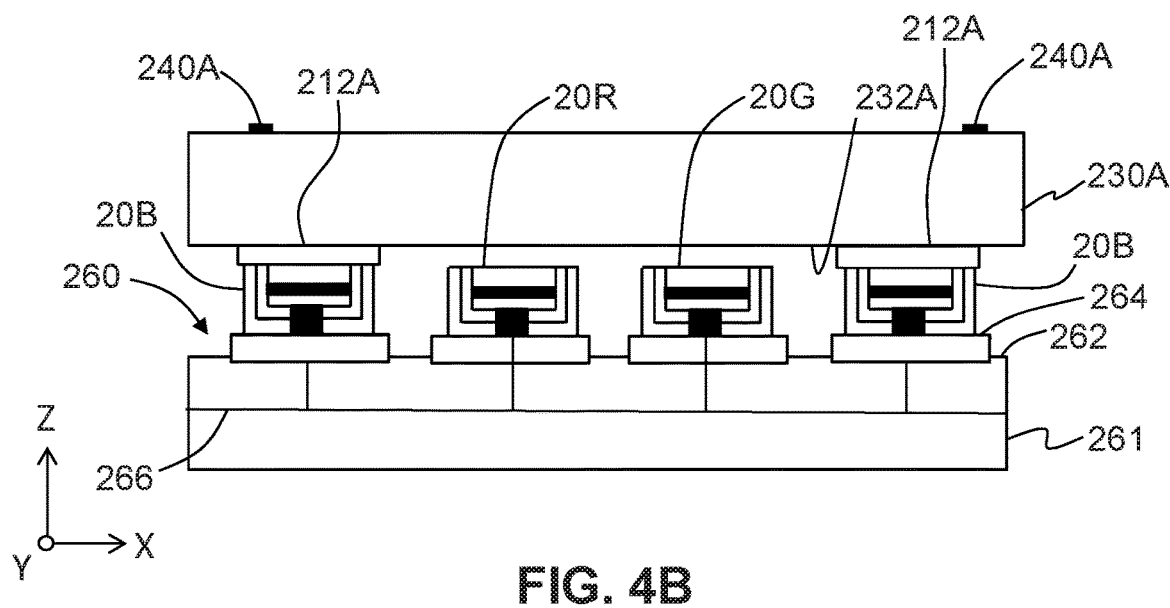

The two inside bonding pads 264 are respectively occupied by a red micro-LED 20R and a green micro-LED 20G while the two outside bonding pads are empty. This pattern repeats for the display backplane 260, of which only a small section is shown in FIG. 4A. With reference now also to FIG. 4B, the first carrier 230A with its blue micro-LEDs 20B is interfaced with the display backplane 260 so that the blue micro-LEDs 20B operably reside on the available bonding pads 264. It is noted that a similar process can be used to establish the locations of the red micro-LEDs 20R and the green micro-LEDs 20G, which are shown as already in place on the display backplane 260. The micro-LED 20B are permanently or tack bonded to the display backplane 260 so that they remain adhered during the subsequent steps.

Figure 4C:
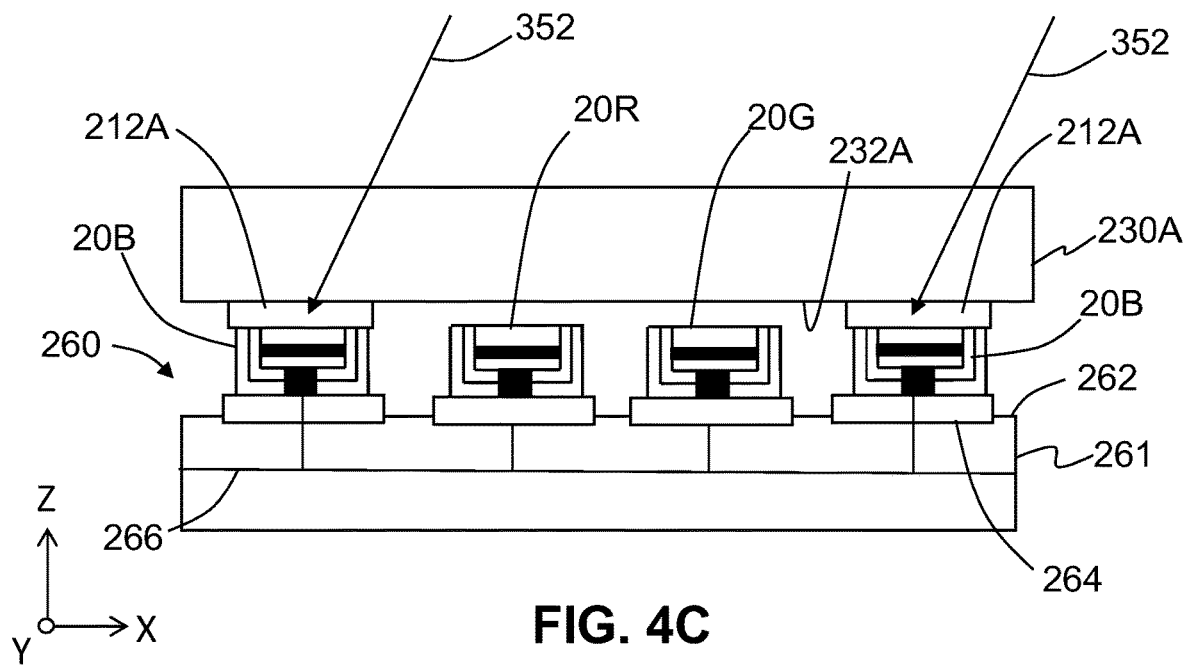

With reference now to FIG. 4C, the light-based debonding process is repeated for the segments 212A that hold the blue micro-LEDs 20B to the surface 232A of the first carrier 230A by irradiating the segments with the actinic light beam 352. This debonds (releases) the blue micro-LEDS 20B from the first carrier. This light-based debonding process can be carried out in the irradiation apparatus referred to above and discussed in greater detail below. The first carrier 230A is then taken away.

Figure 4D:
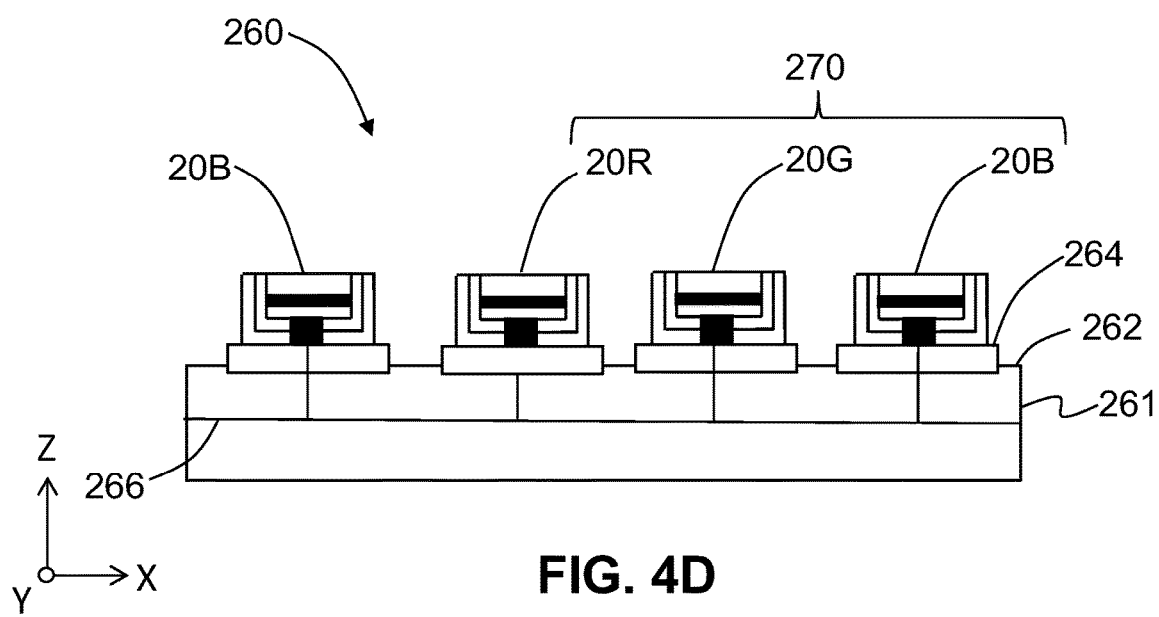
FIG. 4D is a close-up cross-sectional view of a portion of the resulting display backplane showing red, green and blue micro-LEDs.

FIG. 4D shows the resulting portion of the display backplane 260 with the added blue micro-LEDs 20B, which in the example now form with the red micro-LEDs 20R and the green micro-LEDs 20G in an array of micro-LED color pixels 270. The above process can be repeated to populate the entire display backplane 260 with blue micro-LEDs 20B. More generally, the above-described process can be carried out for either single-color micro-LEDs 20 or for different color micro-LEDs, such as the red micro-LEDs 20R, the green micro-LEDs 20G and the blue micro-LEDs 20B. If the micro-LEDs 20R, 20G and 20B are tack bonded to display backplane 260, an anneal can be performed to convert the tack bond to a permanent bond.

The first and second carriers 230A and 230B can have sizes selected to define transfer fields of a desired size. This allows for one or relatively few micro-LED transfer steps to populate the display backplane 260 with micro-LEDS 20 when forming a micro-LED display.

Second Example Method

A second example method for forming an example display backplane 260 is now described in connection with FIGS. 5A through 5K.

Figure 5A:
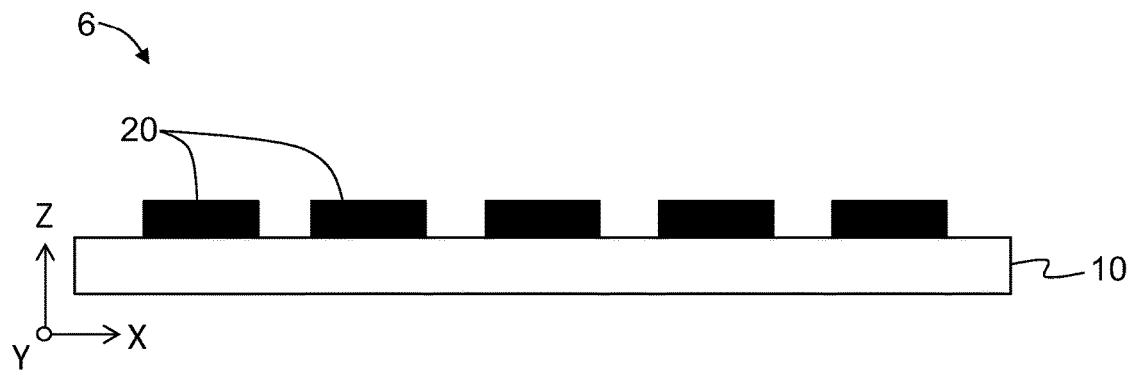
FIGS. 5A through 5D are close-up X-Z cross-sectional views of example process steps performed on a donor wafer to form an example micro-LED carrier structure.

With reference to FIG. 5A, in an initial step, a donor wafer 6 that includes micro-LEDs 20 is formed. The micro-LEDs 20 formed on the donor wafer 6 are shown in simplified form for ease of illustration and because the methods disclosed herein are not limited to a specific micro-LED configuration or method of fabrication.

Figure 5B:
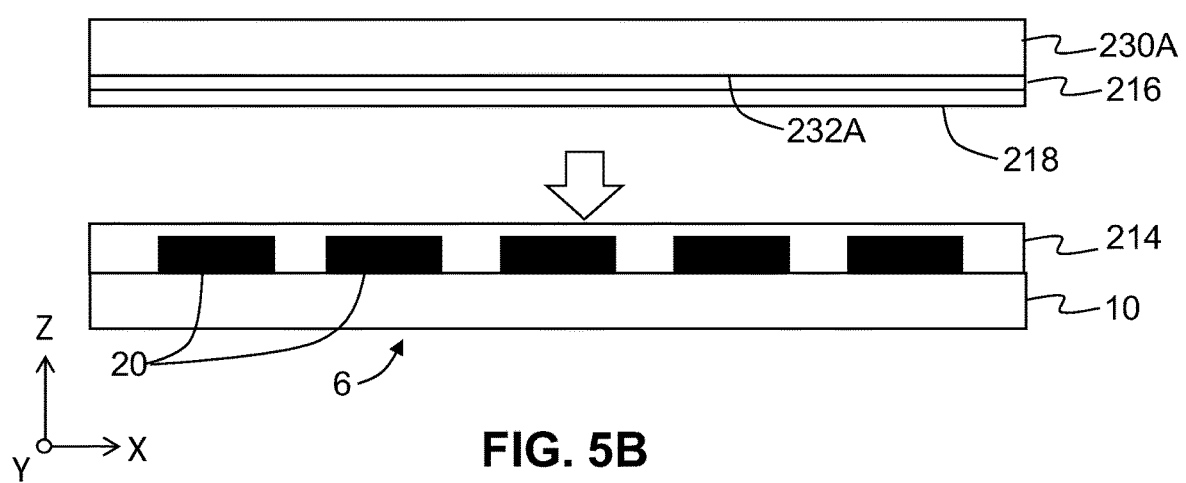

With reference now to FIG. 5B, in the next step, a layer of release material 214 is coated onto the donor wafer 6 atop the micro-LEDs 20 while a layer of adhesive material 216 is coated onto a surface 232A of a first carrier 230A. The layer of release material 214 is shown as non-conformal for ease of illustration. The first carrier 230A and the adhesive material 216 is transparent while the release material 214 is absorbing. An absorber layer 218 (dashed line) can be optionally added to the layer of release material 214 in case the release layer is too thin or not sufficiently absorbent when irradiated by the actinic light beam 352, as explained below. The absorber layer 218 can be used to ensure that subsequent irradiation by the actinic light beam 352 as described below does not cause any light damage to the underlying micro-LEDs 20. As in the first example method, the layer of release material 214 can be applied using a variety of methods, such as spin coating, slit coating, dip coating, ink-jet coating, etc.

Figure 5C:
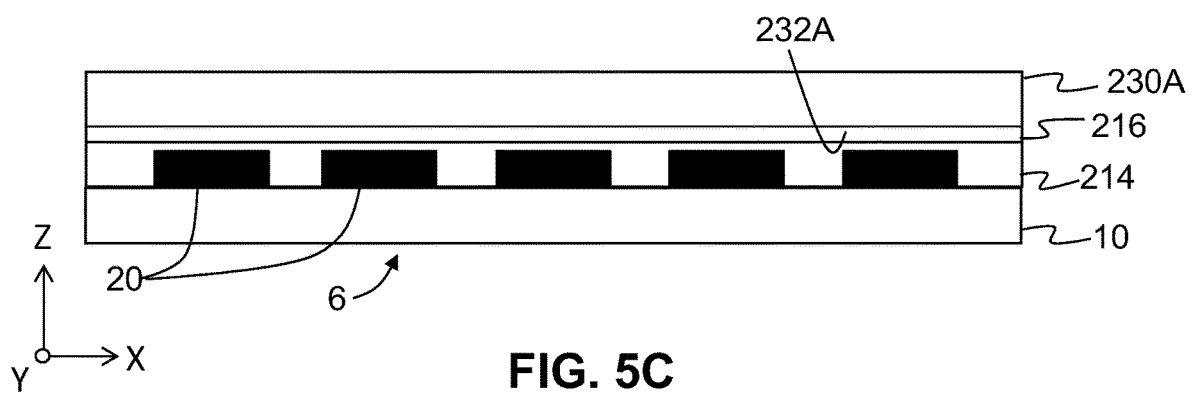

With reference now to FIG. 5C (which does not include the optional absorber layer 218), in the next step, the donor wafer 6 is bonded to the first carrier 230A. This can be accomplished using a conventional thermal bonding process performed in a conventional wafer bonder. The bonding temperature $T_B$ is preferably <250° C. to minimize stress and deformation due to a mismatch in the CTE between the donor wafer 6 and the first carrier 230A. Void-free bonding can be achieved by ensuring that there are no embedded voids during the coating process and also by using vacuum bonding so that any gases trapped between the contacting surfaces are exhausted through the spaces between the singulated micro-LEDs 20.

If the release material 214 cannot be directly bonded to the adhesive material 216, or if the release material has poor adhesion to the donor wafer 6, the release material can be sandwiched between two adhesive materials 216 at the donor wafer. In an example of such a configuration, the outer adhesive material 216 and the release material 214 have a combined thickness of <1 μm. Also in an example, the adhesive material 216 that contacts the donor wafer 6 can be much thicker, e.g., in the range of 2 μm to 10 μm. As noted above in the first example method, the adhesive material 216 can act as a compliant material to compensate for wafer bow/warp and variations in planarity across the surface of the donor wafer 6. During the process of bonding, the adhesive material 216 will get deformed and partially flow into the cavities between the micro-LEDs 20. The height of the micro-LED 20 and adhesive material 216 should be chosen so that adhesive material 216 does not contact substrate 10 after bonding. If the height of micro-LED 20 is insufficient, a sacrificial layer of suitable thickness may be deposited on the top surface of the micro-LED 20 prior to applying the release material 214. A variety of easily removable sacrificial layers can be used. The sacrificial layer also provides backing support for micro-LED 20.

Figure 5D:
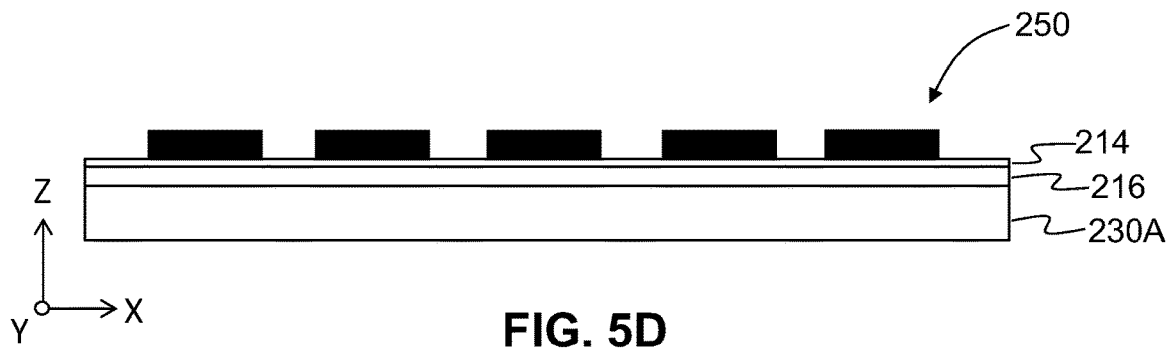

With reference now to FIG. 5D, in the next step, the micro-LEDs 20 can be released from the donor wafer 6 and transferred to the first carrier 230A to form an example micro-LED carrier structure 250. This can be accomplished via techniques known in the art, such as a wet etch that etches a sacrificial release layer (not shown; typically AlAs) between the growth substrate 10 (e.g., a GaAs wafer) and the LED epitaxial stack 14 (see, e.g. FIG. 2C), as described above in connection with the first example method. For a donor wafer 6 that employs a growth substrate 10 made of sapphire with a GaN epitaxial layer 14, laser lift-off can be used to release the micro-LEDs 20. Since the micro-LEDs 20 are singulated, Ga vapors generated during the laser lift-off process can escape into the spaces between the micro-LEDs 20, thereby reducing the likelihood of cracking.

Release of the micro-LEDs 20 onto the first carrier exposes the surfaces of the micro-LEDs chips that were attached to the donor wafer 6. The laser lift-off of the example GaN-on-sapphire configuration can result in Ga droplets on the exposed surfaces. These droplets are typically removed by wet etching. In addition, any protective layers on the micro-LEDs 20 can be etched to expose electrical contacts (e.g., p-contacts 60 as shown on FIG. 2E) to and/or to ensure that light emitted by the micro-LEDs when operably disposed on the display backplane later on in the process can exit the micro-LEDs without significant reflection or absorption losses. Also, any residual material that is bridging or inadvertently connecting the micro-LEDs is removed, e.g., by wet etching. In particular, the adhesive material 216 and the release material 214 is removed.

Figure 5E:
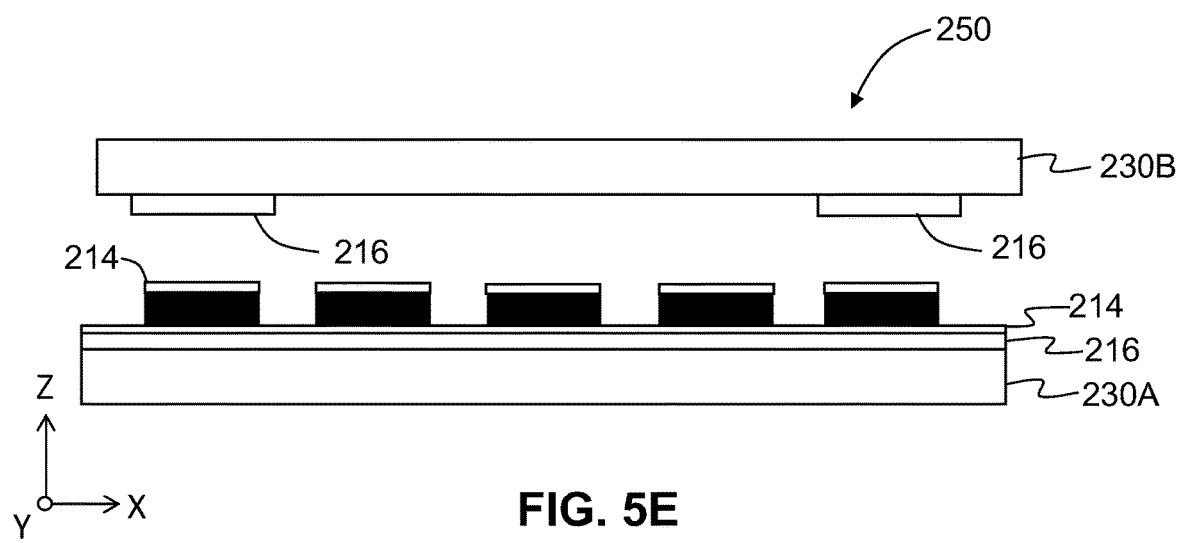
FIGS. 5E through 5J are close-up X-Z cross-sectional views illustrating an example of how the example micro-LED carrier structure of FIG. 5D is used to transfer select micro-LEDs to a second carrier and then to a display backplane using the light-based debonding process disclosed herein.
Figure 5F:
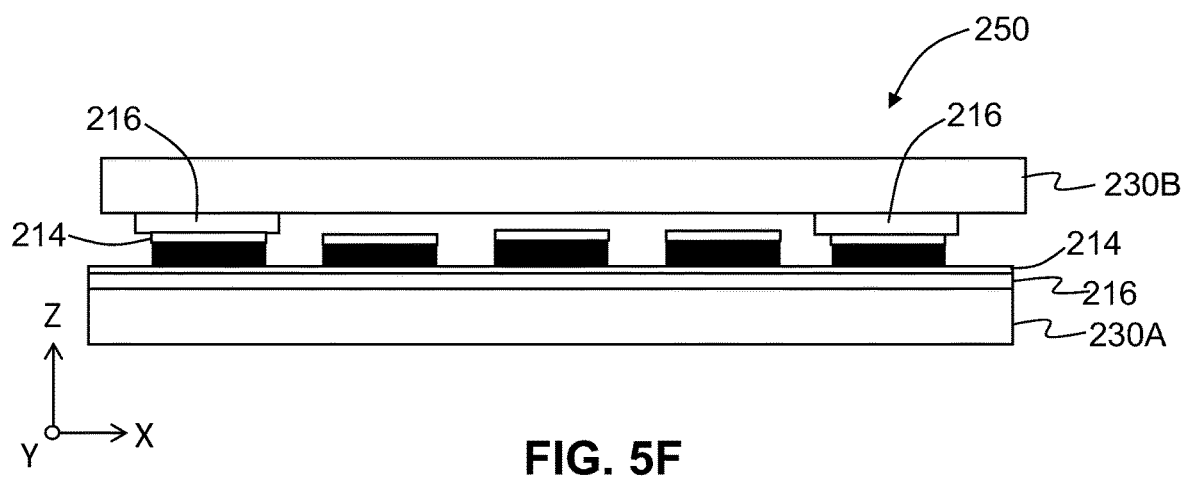

With reference now to FIGS. 5E and 5F, in the next step, the first carrier 230A is bonded to a second carrier 230B. This includes coating the first carrier 230A (and in particular, the micro-LEDs 20 thereon) with release material 214 that at a minimum resides atop each of the micro-LEDs 20 as segments of the release material This step may not be needed if the release layer is selectively processed in the previous step (e.g., removing only the release material 214 from the cavities between the micro-LEDs 20) to leave segments of the release material atop each micro-LED 20.

The second carrier 230B is then coated with a layer of adhesive material 216. In an example, the layer of adhesive material 216 is patterned, i.e., is defined by segments of adhesive material 216 configured to align with select micro-LEDs 20 to be transferred to the second carrier 230B. The modifications to the release material 214 to ensure good adhesion and to avoid irradiation-induced damage to the underlying micro-LEDs 20 discussed above are applicable in this step as well. The thickness of adhesive material 216 should be sufficient so that carrier 230B does not contact the micro-LEDs 20 in the openings between adhesive material 216. If necessary, carrier 230B can be fabricated with raised portions corresponding to the locations of the patterned adhesive material 216 or a patterned sacrificial layer can be placed between carrier 230B and the patterned adhesive material 216.

Figure 5G:
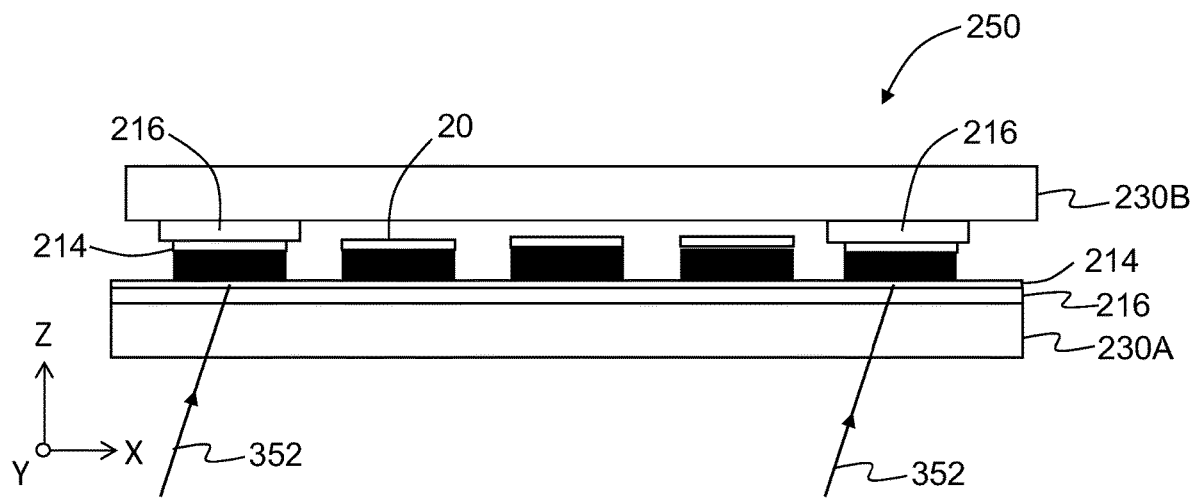
Figure 5H:
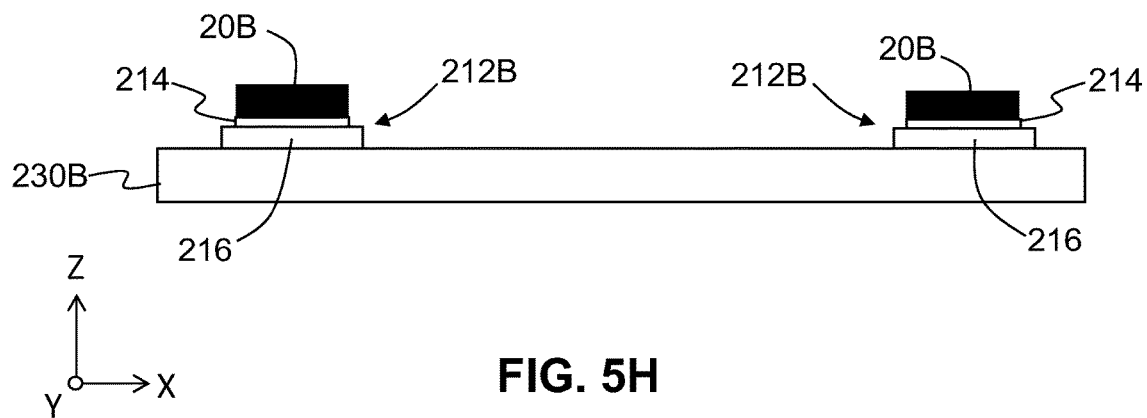

With reference now to FIGS. 5G and 5H, the select micro-LEDs 20 are released onto the second carrier 230B by carrying out the light-based debonding process through the first carrier 230A. The light-based debonding process can be performed using the aforementioned irradiation apparatus and the associated irradiation methods as described in greater detail below. The irradiation of the release material 214 by the actinic light beam 352 can be localized to the portion of the release material that resides beneath the select micro-LEDs. This irradiation causes the irradiated portion of the release material 214 to weaken or be ablated, thereby releasing the corresponding micro-LED 20 from the first carrier 230A. This process is repeated for the other select micro-LEDs 20. This allows for the transfer of the select micro-LEDs 20 from the first carrier 230A to the second carrier 230B.

At this point, any residual material (e.g., release material 214, adhesive material 216, etc.) can be removed using processes known in the art. FIG. 5H shows the second carrier 230B carrying (supporting) the two transferred micro-LEDs 20 on two segments 212B, with each segment comprising the release material 214 and the adhesive material 216. In FIG. 5H, the micro-LEDs 20 are shown as being blue micro-LEDs 20B.

This transfer process can be repeated with other second carriers 230B to populate multiple second carriers with the remaining micro-LEDs from the first carrier 230A. For example, if every fifth micro-LED 20 in both the −x-direction and y-direction on the first carrier 230A is transferred each time, a total of twenty-five transfers is required to transfer all the micro-LEDs 20 from the first carrier 230A to multiple second carriers 230B. The release material 214 can be optionally removed and re-coated onto the first carrier 230A after each transfer so that a fresh release layer is available for bonding. On the other hand, the adhesive material 216 on second carrier 230B remains fresh since each of the multiple second carriers is used only once.

Figure 5I:
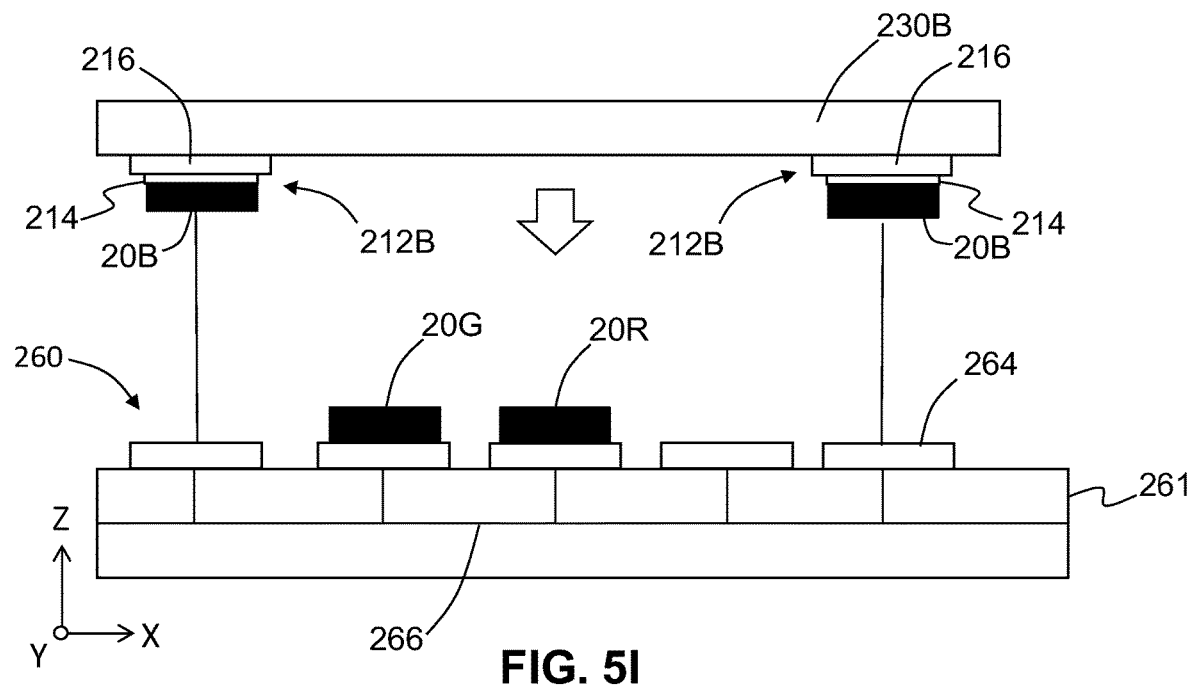
Figure 5J:
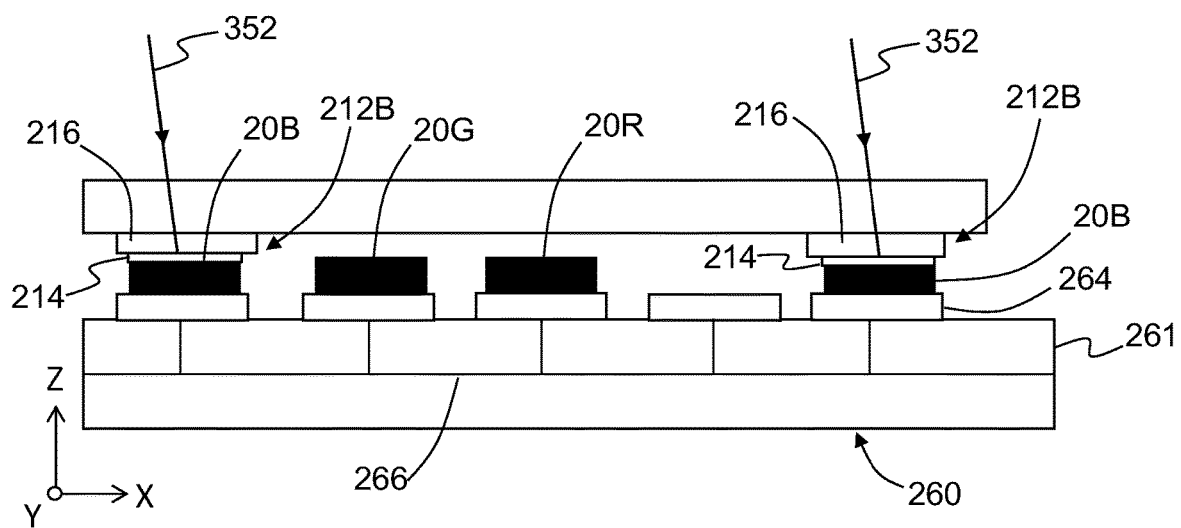
Figure 5K:
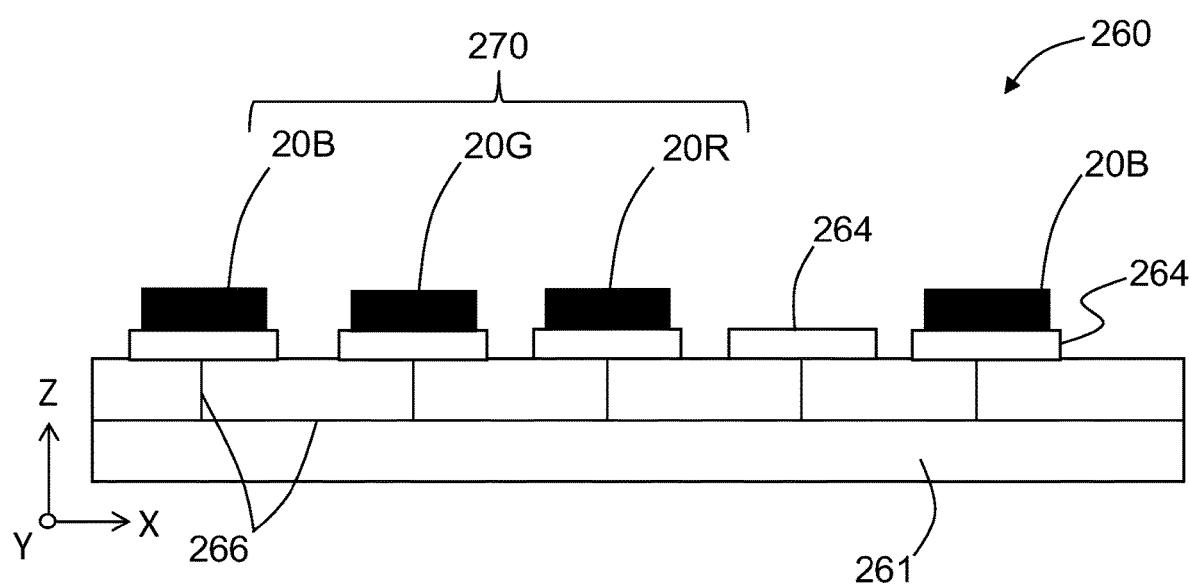
FIG. 5K is a close-up X-Z cross-sectional view of a portion of the resulting display backplane showing red, green and blue micro-LEDs.

With reference now to FIG. 5I, the blue micro-LEDs 20B of the second carrier 230B are aligned with respective bonding pads 264 on a display backplane 260, which is shown as already having a green micro-LED 20G and a red micro-LED 20R mounted to other bonding pads. Once so aligned, the second carrier 230B is interfaced with the display backplane 260 so that the two blue micro-LEDs 20B supported thereby are brought into contact with their respective aligned bonding pads 264, as shown in FIG. 5J. The blue micro-LEDs are tack-bonded to the bonding pads 264 using a low-temperature bonding process (<80° C.), as shown in FIG. 5J. The blue micro-LEDs 20B are then released by performing the light-based debonding process. The resulting portion of the display backplane 260 is shown in FIG. 5K.

Note that since both of the two blue micro-LEDs 20B are to be released onto the display backplane 260, the light-based debonding process can be carried out by irradiating the entire second carrier 230B with the actinic light beam 352, e.g., by scanning the actinic light beam over the entire second carrier. If damage to the display backplane 260 or micro-LEDs already on backplane 260 is a concern, the selective release method can be used.

Third Example Method

A third example method for forming an example backplane 790 (FIG. 5'J) is now described in connection with FIGS. 5'A through 5'J.

FIG. 5'A shows a donor wafer 700 comprising a plurality of micro-LEDs 710 on a wafer 720 (here, sapphire, e.g.) having a residual u-GaN layer 730. In one example, each micro-LED 710 comprises an InGaN/GaN stack. In this example, metal lift-off is used to terminate the p and n contacts of the micro-LEDs 710 with gold for a final solid-liquid interdiffusion bonding (also known as transient liquid phase or TLP bonding) to a receiving backplane 790 (FIG. 5'J), for example, a receiving backplane comprising indium bumps 785 (FIG. 5'J).

FIG. 5'B shows the micro-LEDs 710 being prepared for laser lift-off. A seed layer 740, composed of, for example, Ti(20 nm)/Cu(300 nm), is sputtered onto the donor wafer 700 to coat the micro-LEDs 710. Thereafter, a relatively thick layer of photoresist 750 is patterned over the donor wafer 700.

FIG. 5'C shows a support layer 755 formed on the donor wafer 700. In one example, support layer 755 is formed from nickel and is created using semi-additive plating. In this example, support layer 755 is used for laser lift-off as well as a hard mask used in dry etching (using, for example, inductively coupled plasma) of the donor wafer 700 (as shown in FIG. 5'D) to singulate the micro-LEDs 710 into individual chips. Donor wafer 700 may be bowed or warped or otherwise have variations in planarity. Support layer 755 may be used to flatten donor wafer 700 to a target surface tolerance or shape to ensure adequate adhesion to first and/or second carriers 770, 775 (FIG. 5'h). Flatness of donor wafer 700 can be controlled by controlling mechanical stress in support layer 755, for example, by controlling chemistry and plating conditions during plating of the support layer. For example, a chloride content may be varied in the plating solution and the plating current density and plating solution temperature may be varied to control mechanical stresses in support layer 755.

In FIG. 5'E, the donor wafer 700 is bonded to a first carrier 770, which is coated with a releasable bonding layer 760. In an example, first carrier 770 is glass. Any one or more of the release materials and adhesives disclosed herein may be used for releasable bonding layer 760, such as HD3007 (a polyimide) and benzocyclobutene (BCB), among others. Releasable bonding layer 760 can be applied, for example, using a spin coater, and the donor wafer 700 and the first carrier 770 may be bonded using a bonder such as a SUSS Bonder SB6. In one example, releasable bonding layer 760 may be lithographically patterned so that it is only present in the regions of first carrier 770 that are bonded to micro-LEDs 710.

FIG. 5'F shows the micro-LEDs 710 (temporarily bonded to the first carrier 770) removed from wafer 720 using a laser lift-off operation performed, for example, using a high power pulsed UV or Q-switched IR pulsed laser.

FIG. 5'G shows first carrier 770 with the now-released micro-LEDs 710 after cleaning with a dilute acid, such as dilute hydrochloric acid, to remove residual Ga material, followed by removal of portions of releasable bonding layer 760 between the micro-LEDs 710 using, for example, $O_2$ plasma dry etching.

FIG. 5'H shows the temporarily bonded micro-LEDs 710 from FIG. 5'G bonded to a second carrier 775. Second carrier 775 is patterned with mesas 777 (only one labeled) that are configured and dimensioned to be aligned with micro-LEDs 710. In an example, second carrier 775 is glass. Second carrier 775 includes a releasable bonding layer 780 that is patterned on the patterned mesas 777 to selectively bond to desired ones of the micro-LEDs 710 from first carrier 770 (see FIG. 5'I). Releasable bonding layer 780 has a pattern that is designed and configured so that after the bonding process, the releasable bonding layer fully spreads over and covers the surface of the corresponding chip (micro-LED 710) being picked up but does not fill the cavity between adjacent chips (micro-LEDs 710).

FIG. 5'I shows the desired ones of the micro-LEDs 710 transferred onto the patterned second carrier 775 by selectively debonding the corresponding chips from the first carrier 770 using an actinic light beam (not illustrated). Any of a variety of actinic light beams may be used, for example, a UV laser beam. The actinic light beam has a size and position to selectively debond only selected chips (micro-LEDs 710) from first carrier 770 so that only the selected chips (micro-LEDs 710) are transferred to the second carrier 775, while the remainder stay on the first carrier 770.

FIG. 5'J shows the selectively debonded micro-LEDs 710 assembled on the receiving backplane 790 where the gold covered p and n contacts of the micro-LEDs 710 are bonded to the indium bumps 785 on the receiving backplane 790. Prior to bonding, support layer 755 and seed layer 740 are removed, for example, using a wet etch to expose the gold p and n pads on the micro-LEDs 710. FIG. 5'J also shows micro-LEDs 710 released from second carrier 775. Micro-LEDs 710 can be released from second carrier 775 after they are assembled on the receiving backplane 790 by, for example, by irradiating the segments of releasable bonding layer 780 with an actinic light beam (not illustrated) that travels through second carrier 775 to the segments of the releasable bonding layer. In other examples, any of a variety of release methods may be used to release micro-LEDs 710 from second carrier 775 such as wet chemical release, thermal release or laser release. Second carrier 775 can then be cleaned and readied for reuse.

Finalizing the Display Backplane

After the micro-LEDs 20 (e.g., blue, red and green micro-LEDs 20B, 20R and 20G) have been transferred to the display backplane 260 using either of the above-described methods, the display backplane can be annealed at an annealing temperature $T_A$ (e.g., $T_A < 250°$ C.) to form a eutectic bond between contacts (e.g., p-contacts 60) of the micro-LEDs 20 and the bonding pads 264 if this bonding step has not yet been carried out.

Figure 6A:
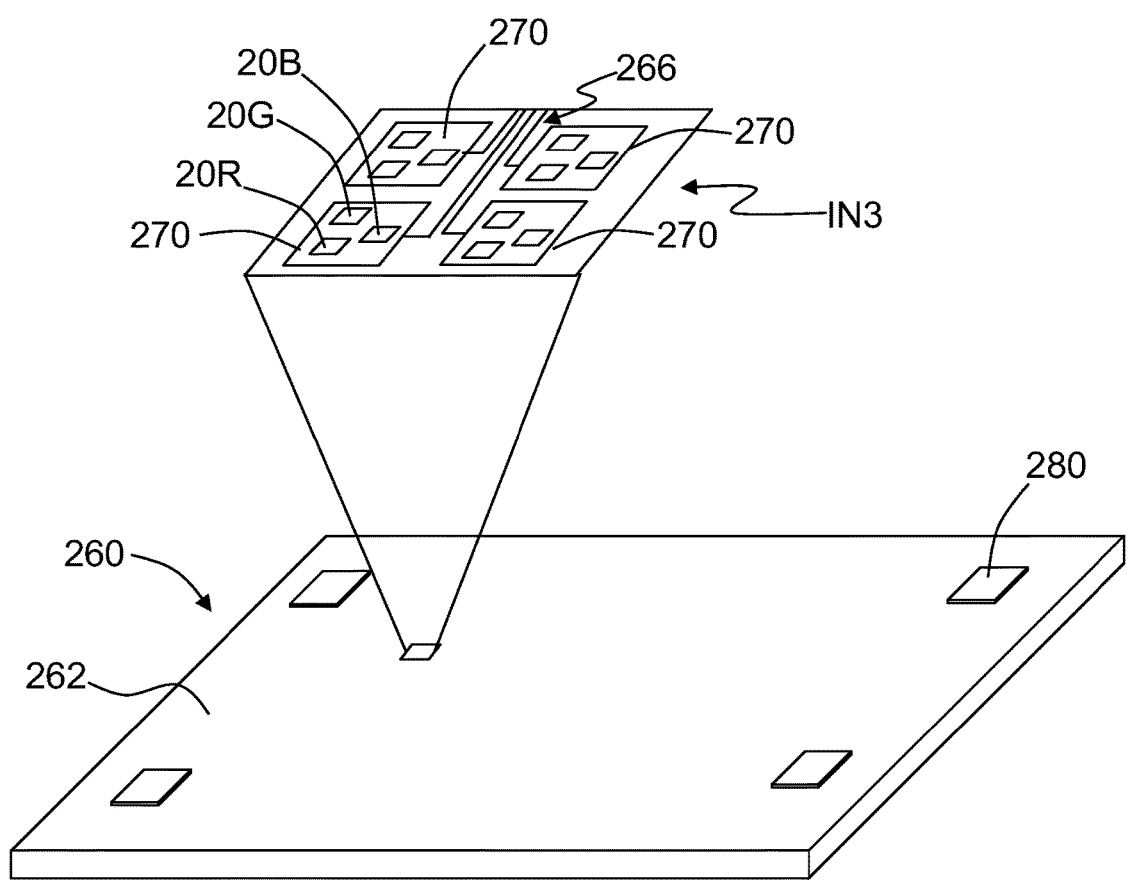
FIG. 6A is an elevated view of an example of the resulting portion of the display backplane of FIG. 5K.
Figure 6B:
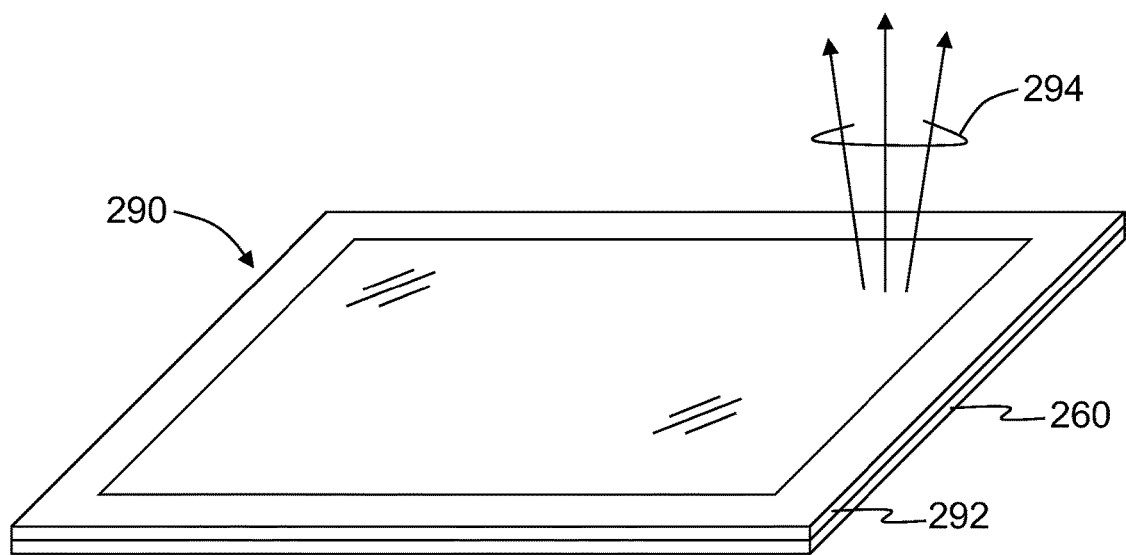
FIG. 6B is an elevated view of an example micro-LED display formed using the display backplane of FIG. 6A.

FIG. 6A is an elevated view of an example of the resulting fully populated display backplane 260. In an example, the display backplane 260 can operably support one or more other types of devices 280, such as integrated circuits, sensors, other types of light-emitting devices, digital mirror devices (DMDs), micro-electrical-mechanical systems (MEMS), etc. The close-up inset IN3 shows the micro-LED color (RGB) pixels 270 along with the conductive paths 266 that electrically connect the micro-LEDs and the devices 280 to a power source (not shown). FIG. 6B is an elevated view of a final micro-LED display 290 that includes a cover glass 292 operably disposed on the display backplane 260. The micro-LED display 290 emits display light 294, which in an example is based on a display color gamut as defined by the RGB pixels 270 operably supported by the display backplane 260.

The display backplane 260 can be inspected, including electrically tested (e.g., via electrical probing) to identify if any defective micro-LEDs 20 should be repaired or replaced. After replacing any defective micro-LEDs 20, the display backplane 260 may be annealed once again to form a eutectic bond between the contacts 60 of the micro-LEDs 20 and the bonding pads 264 of the display backplane 260. If a tack bond is sufficient for electrical testing, the first annealing step after transfer of the different color micro-LEDs can be skipped. The inspection process can also include optical inspection and photo-luminescence mapping.

When repairing the display backplane 260 by replacing defective micro-LEDs 20 with operable micro-LEDs using the second method, in an example only a small subset of the micro-LEDS 20 on the carrier 230B are released onto the display backplane 260. In this case, the light-based debonding process can be applied to the selected micro-LEDs 20 on the second carrier 230B.

If the micro-LEDs 20 are sufficiently large, and the number of defective micro-LEDs 20 to be replaced is small, a pick-and-place process for individual micro-LEDs can be used. A laser-based repair process can then be used to electrically isolate the defective micro-LEDs and electrically connect the replacement micro-LEDs.

In an example repair process, the dose of the actinic light beam 352 during the light-based debonding process is selected so that the micro-LED 20 being transferred to the bonding pad 264 gets sufficiently hot enough to tack-bond to the bonding pad. Alternatively, two exposures can be employed during the light-based debonding process, wherein a first exposure using the actinic light beam 352 releases the micro-LED 20 from the second carrier 230B and a second exposure with an exposure beam having a different wavelength is used to tack-bond the micro-LED 20 by low-temperature local heating of the micro-LED once it is in place on its bonding pad 264.

To avoid interference between adjacent micro-LEDs 20 having different overall thicknesses while transferring the micro-LEDs to the display backplane 260, the thinnest micro-LEDs 20 (i.e., ones with the thinnest stack based on its color for example) can be bonded first, and the thickest micro-LEDs can be bonded last. Other methods to avoid interference include using bonding pads 264 (e.g., bonding pads) having different heights for the red, blue and green micro-LEDS 20R, 20B and 20G, respectively.

The projected performance of a micro-LED display 290 that employs the display backplane 260 as formed herein can exceed that of existing LED, LCD and OLED displays while the micro-LED transfer methods that employ a light-based debonding process simplifies the fabrication steps.

Control of the Emission Wavelength Uniformity Over the Display Backplane

In some cases, the size of the donor wafer 6 can be substantially smaller than the resulting micro-LED display 290 formed using the methods disclosed herein. This requires the use of multiple donor wafers 6 to contribute micro-LEDs having the same wavelength.

A potential problem with this approach is that the emission wavelengths of same-color micro-LEDs 20 formed on different donor wafers 6 can vary between the donor wafers, and can also vary within a given donor wafer. Consequently, an aspect of forming the display backplane 260 and micro-LED display 290 as disclosed herein includes methods of controlling the uniformity of the emission wavelength over the display backplane.

Figure 7A:
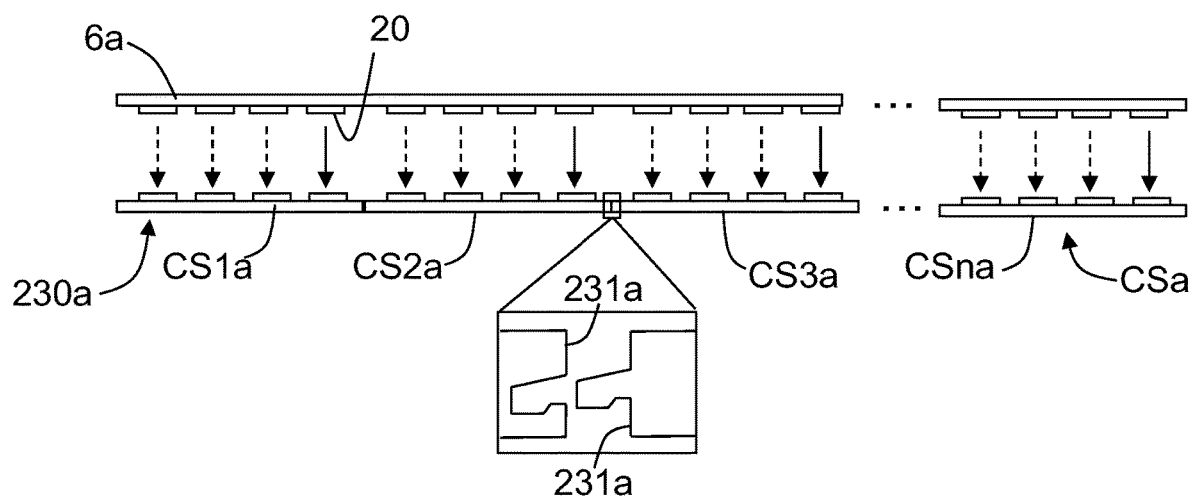
FIG. 7A is an X-Z cross-sectional view of an example donor wafer and schematically illustrating the transfer of the micro-LEDs of the donor wafer to a segmented carrier.

With reference to FIG. 7A, in an initial step, the micro-LEDs 20 (only one labeled for convenience) from a donor wafer 6a are transferred onto a first segmented carrier 230a. The first segmented carrier 230a comprises an array (assembly) of closely packed carrier segments CSa (CS1a, CS2a, CS3a, . . . CSna). In examples, each carrier segment CSa can be either square, rectangular, triangular, or hexagonal, or generally any rearrangeable tessellation shape. In other words, in an example, the carrier segments CSa are such that the first segmented carrier 230a can be reassembled with the carrier segments rearranged, i.e., in different positions from their original position.

With reference to the close-up inset of FIG. 7A. In an example, adjacent carrier segments Csa can mechanically engage and disengage (i.e., connect and disconnect) with one another at their respective ends 231a using for example a "snap lock" mechanism (e.g., interlocking tongue and groove connection) similar to how certain types of flooring panels can be readily connected to and unconnected from each other. Further, in an example, each carrier segment Csa can be configured to electrically support (e.g., with bonding pads 264 and conductive paths 266; see FIG. 5K) each micro-LED so that it can be operated to assess one or more of its operating characteristics, such as emission wavelength vs injection current, functionality (yield), etc. In another example, the one or more operating characteristics of the micro-LEDs 20 can be assessed while they are still incorporated on the donor wafer 6a, so that the segmented carrier 230a can comprise simple monolithic carrier segments CSa. Each carrier segment Csa can also be mounted on a transparent support wafer with a tack bond so that the carrier segments Csa can be easily separated.

The above process can be repeated for additional donor wafers 6b, 6c, etc., and additional segmented carriers 230b, 230c, etc. (not shown).

Figure 7B:
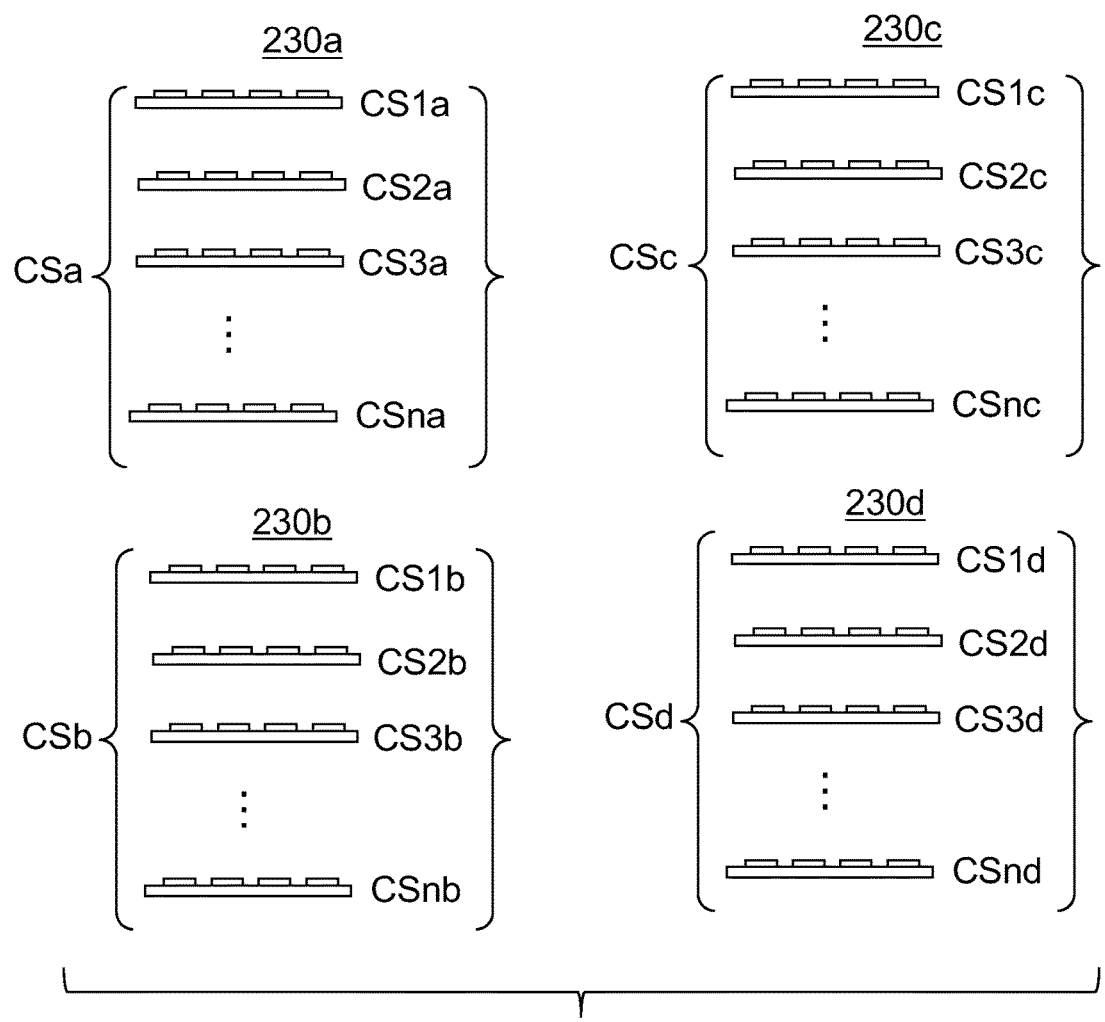
FIG. 7B illustrates an example of how the carrier segments of four different segmented carriers are disconnected.

After the micro-LEDs 20 from multiple donor wafers 6 have been transferred to their corresponding segmented carriers 230a, the carrier segments CSa are disassembled, as shown in FIG. 7B. FIG. 7B shows the carrier segments CSa, CSb, CSc and CSd for respective first segmented carriers 230a, 230b, 230c and 230d.

Figure 7C:
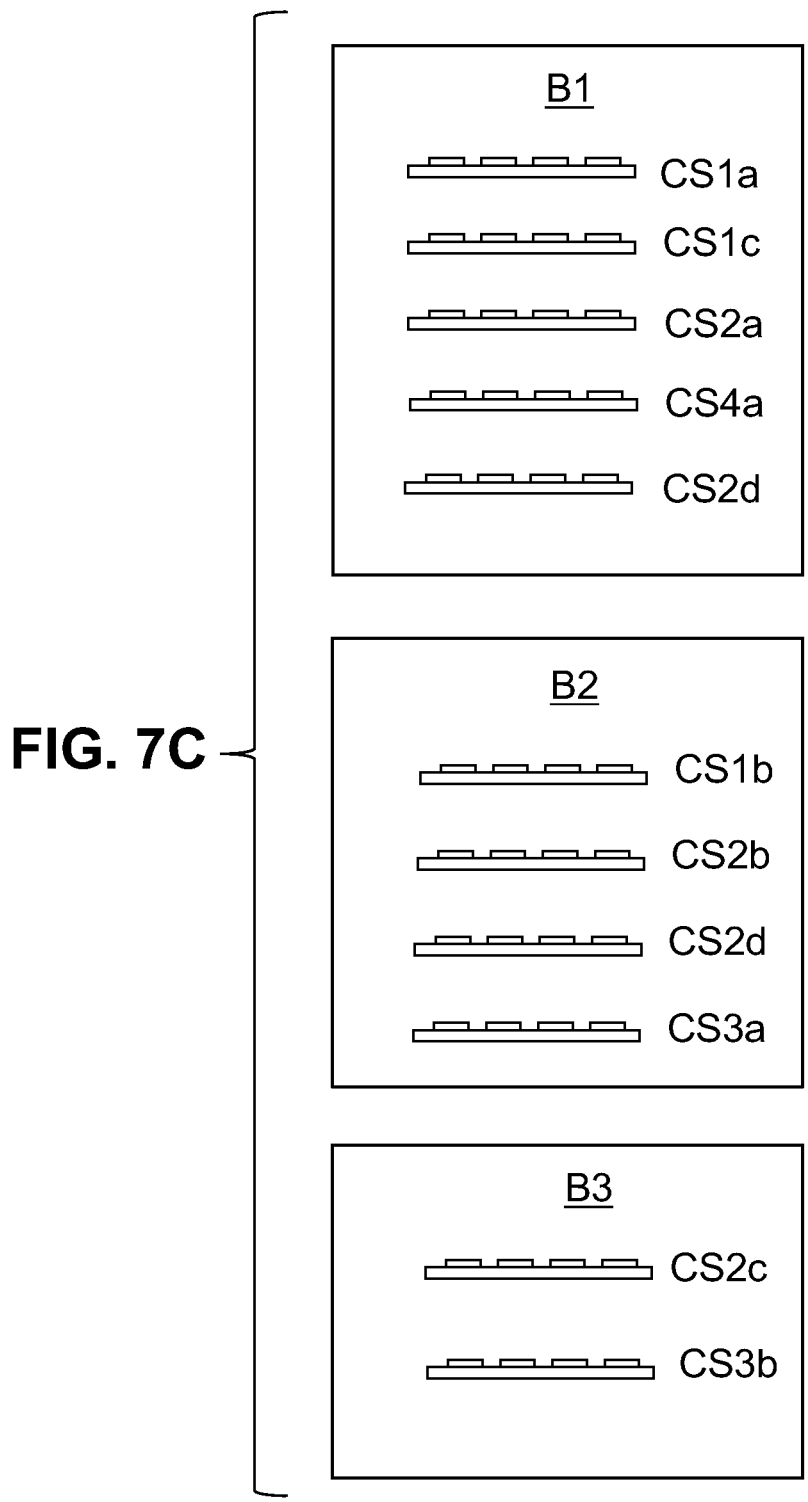
FIG. 7C is a schematic diagram that illustrates how the carrier segments from the different segmented carriers can be sorted based on one or more operational characteristics of the micro-LEDS of the carrier segments.

Next, with reference to FIG. 7C, the carrier segments CS for each of the segmented carriers 230a, 230b, 230c and 230d are sorted by one or more of the operating characteristics, such as yield and emission wavelength, and placed into bins B1, B2 and B3. In an example, the three bins B1, B2 and B3 can represent blue micro-LED peak emission wavelengths of 450 nm, 451 nm and 452 nm. The sorting process can be carried out such that the sorted carrier segments CS residing in each bin B1, B2, B3 (etc.) match a given operating characteristic to within a select threshold, e.g., a select amount of variation from a center emission wavelength. The typical allowable variation is color dependent but could be as low as 1 nm especially for blue micro-LEDs that operate at ~450 nm.

Figure 7D:
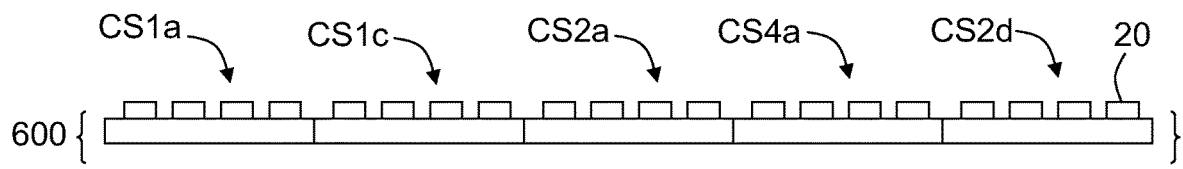
FIG. 7D is a side view illustrating an example of how the sorted carrier segments from the first bin can be assembled (connected) to form an interposer.

Two or more of the sorted carrier elements CS are then selectively reassembled from the bins B1, B2 and B3 (etc.) to form an interposer 600, which in an example is a micro-LED carrier structure that meets select criteria, such as the aforementioned micro-LED yield and wavelength uniformity criteria. FIG. 7D shows an example interposer 600 formed by the carrier elements CS that were placed in bin B1, i.e., CS1a, CS1c, CS2a, CS4a and CS2d. The interposer 600 may have a different size and shape compared to the donor wafer 6. For example, the interposer 600 could be rectangular and its size could be a multiple or submultiple of the backplane 260 so that one interposer 600 can be used for multiple backplanes 260 or multiple interposers 600 can be used to populate a single backplane 260.

Figure 7E:
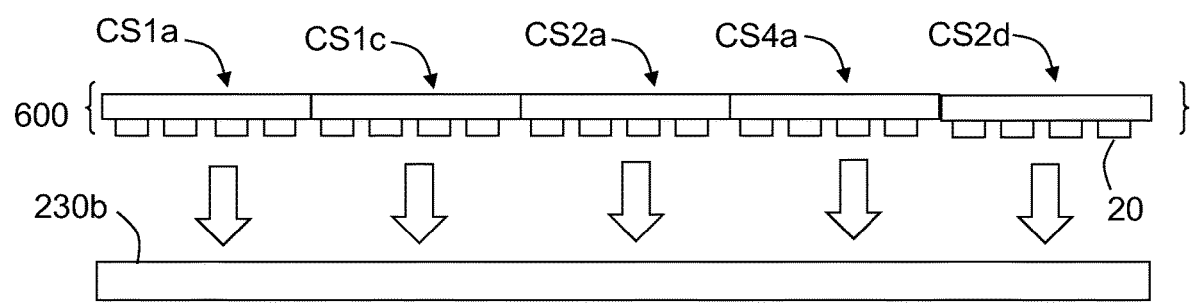
FIGS. 7E and 7G are side views illustrating how the interposer can be used to transfer the micro-LEDs to a second carrier, wherein the micro-LEDs have substantially the same select operating characteristic as used to sort the carrier segments.
Figure 7F:
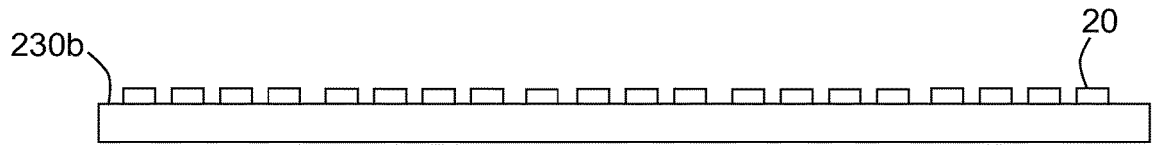
Figure 7G:
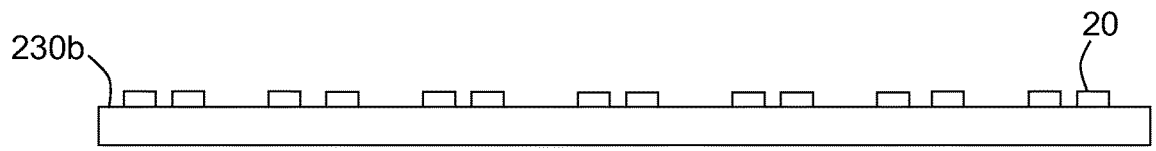

The interposer 600 is then used to transfer selected micro-LEDs 20 onto a second carrier 230b, as shown in FIGS. 7E and 7F. The example of FIG. 7F shows a fully populated second carrier 230b. In an example shown in FIG. 7G, the second carrier can be selectively populated with micro-LEDs 20. The second carrier 230b can then be used to transfer the micro-LEDs to the display backplane 260. Or, the interposer 600 can be used to transfer the micro-LEDs to the display backplane 260, depending on the particulars of the display backplane fabrication process. As mentioned before, the overall dimensions of the interposer 600 can be selected to be a sub-multiple or a super-multiple of the size of the display backplane 260. The micro-LEDS 20 supported by the resulting second carrier 230b or display backplane 260 have substantially the same select operating characteristic as used to sort the carrier segments from the different donor wafers 6a, 6b, 6c, etc.

Using the methods described above in combination with the sorting and transfer methods of the present discussion, an electrically functional display backplane 260 comprising red, green and blue micro-LEDs 20R, 20G and 20B with substantially uniform performance to within select tolerances or criteria (e.g., color) can be fabricated.

While the foregoing disclosure is primarily focused on methods of transferring micro-LEDs, the same or similar methods can be used for transferring other devices, such as other types of light-emitting devices (e.g., laser diodes, among others), sensing devices (e.g., electromagnetic radiation sensing devices, e.g., photodiodes, infrared sensing devices, x-ray sensing devices, etc.), microelectromechanical devices (e.g., micromirrors, among others), integrated circuits, solar cells and any combination thereof, among others. Fundamentally, the only requirements for devices that the disclosed transfer methods can be used for are that their compositions and configurations be compatible with the materials, processing steps, and methodologies of the transfer method(s) implemented.

Irradiation Apparatus

Figure 8A:
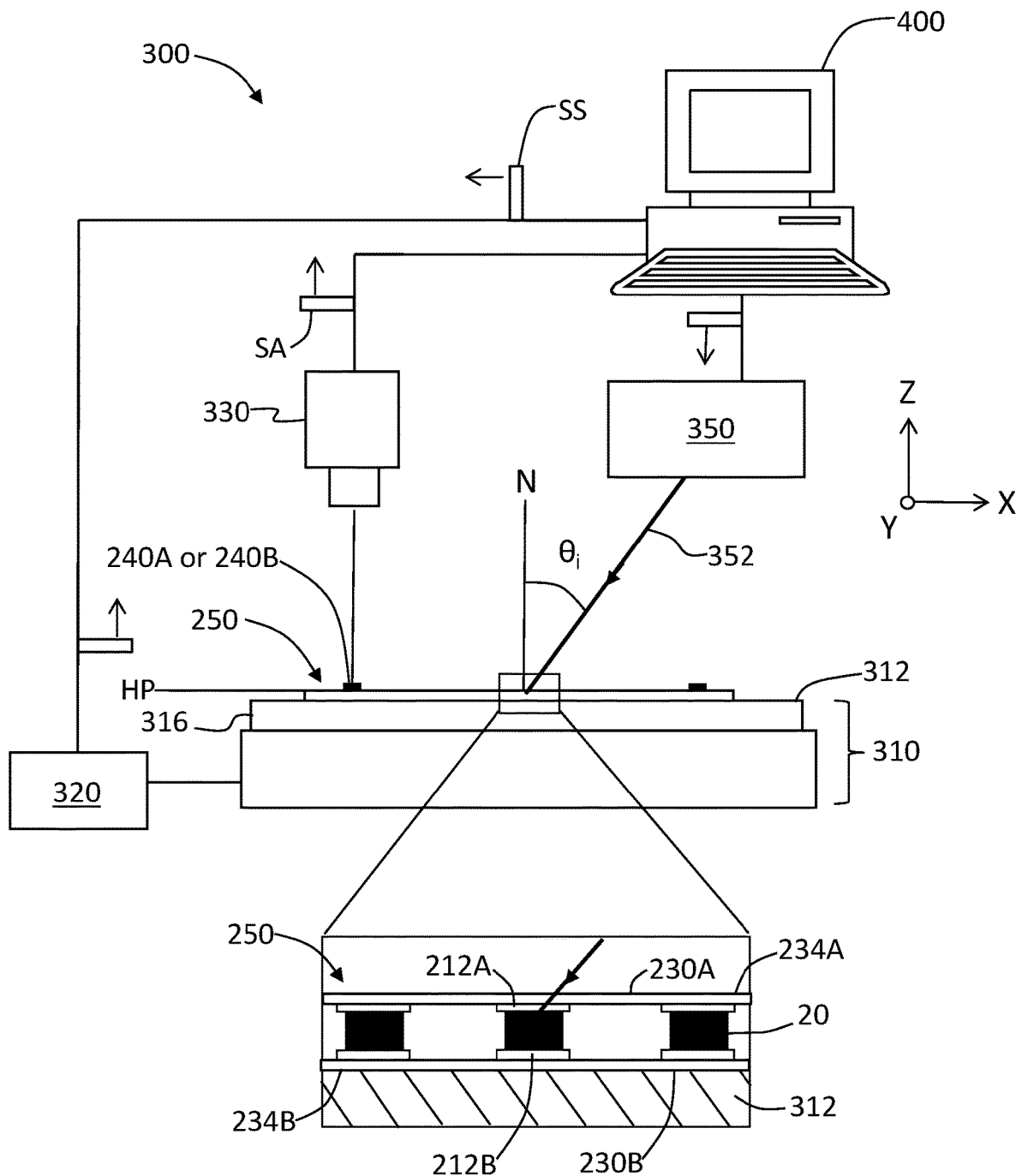
FIG. 8A is a schematic diagram of an example micro-LED carrier structure as operably disposed in an example irradiation apparatus used to carry out the light-based debonding process as described herein.

FIG. 8A is a schematic diagram of an example micro-LED carrier structure 250 as operably disposed in an example irradiation apparatus 300 used to carry out the above-described light-based debonding process. In the example shown, the irradiation apparatus 300 is used to irradiate the segments 212A of the example micro-LED carrier structure 250 with the actinic light beam 352 to selectively release the micro-LEDs 20.

The irradiation apparatus 300 includes a movable support stage 310 with a support surface 312 configured to support the micro-LED carrier structure 250. In an example, the support stage 310 includes a chuck 316 that defines the support surface 312.

A support stage controller 320 is operably connected to the support stage 310 and controls the movement of the support stage in response to stage control signals SS from a main controller 400 operably connected to the support stage controller. The support stage controller 320 also measures the position of the support stage 310 (relative to a reference position) and provides this position information to the main controller 400. The uppermost surface 234A or 234B is positioned to reside in an X-Y plane HP (for "horizontal plane").

The irradiation apparatus 300 also includes an alignment system 330 which is configured to measure (e.g., image) the alignment marks 240A or 240B, depending on which of the first and second carriers 230A and 230B of the micro-LED carrier structure 250 is closest to the irradiation apparatus. The alignment system 330 sends to the main controller 400 an alignment signal SA representative of the measurement of the given alignment mark 240A or 240B. Since the alignment marks 240A and 240B reside at a known position relative to the micro-LEDs 20 (only one labeled for convenience), the alignment signals SA can be used by the main controller 400 to position the support stage 310 at a select location for processing the micro-LED carrier structure 250.

The irradiation apparatus 300 also includes an irradiation system 350 configured to generate the actinic light beam 352. Example configurations of the irradiation system 350 are discussed in greater detail below. The actinic light beam 352 is used to irradiate select segments 212A and 212B that hold the micro-LEDs 20 in place in the micro-LED carrier structure 250 to release the micro-LEDs 20 from either the first carrier 230A or the second carrier 230B. In an example, the actinic light beam 352 has an ultraviolet actinic wavelength $\lambda_a$.

Figure 8B:
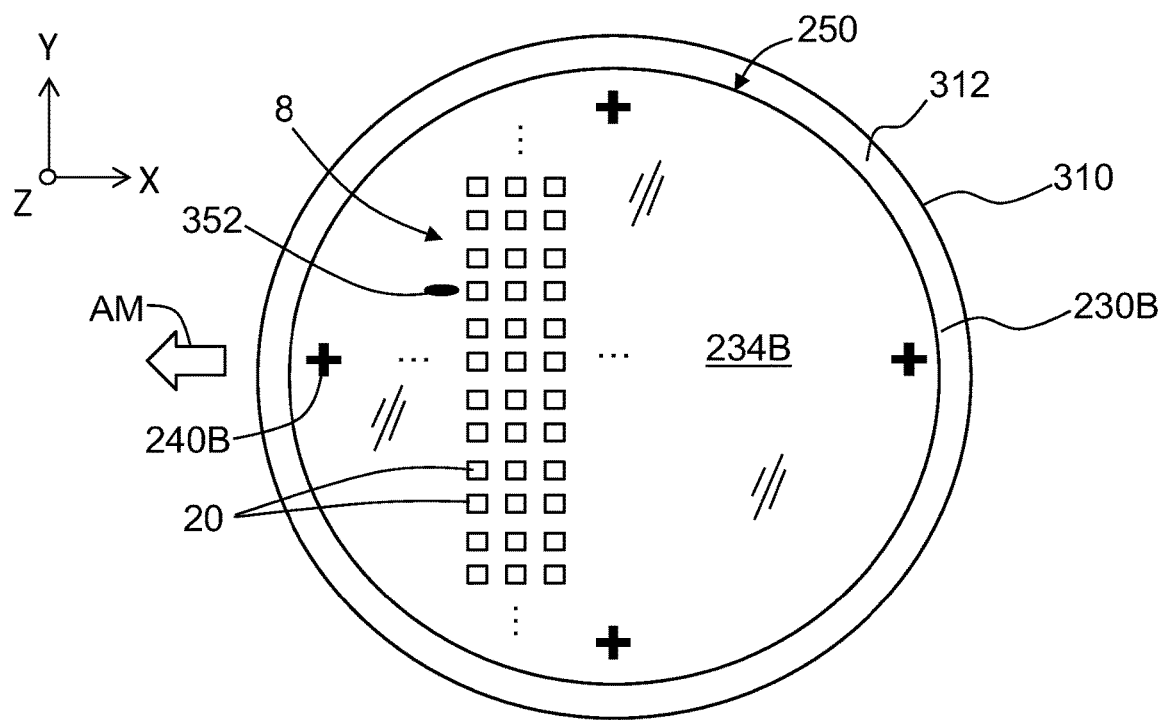
FIGS. 8B and 8C are top-down views of the support stage showing the example micro-LED support carrier of FIGS. 3I and 3J with the second carrier face up (FIG. 8B) and the first carrier face up (FIG. 8C).
Figure 8C:
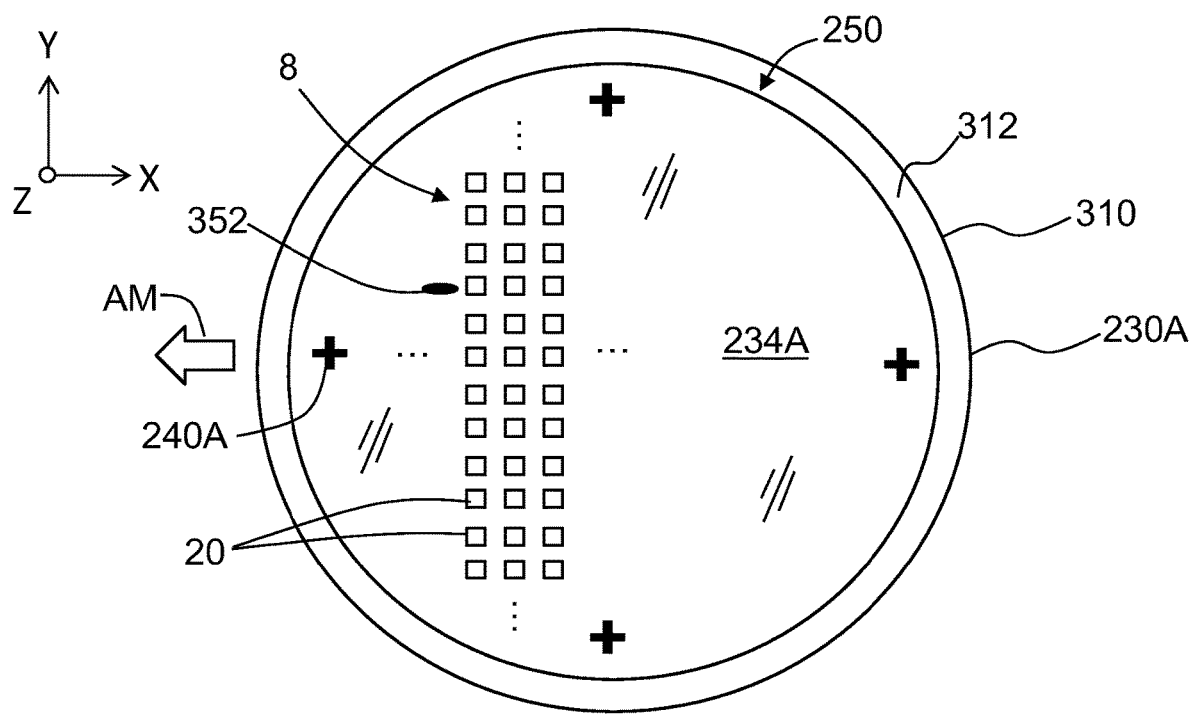

To accomplish the selective irradiation step, the actinic light beam 352 is directed to travel in a select direction to intersect the X-Y plane HP. FIG. 8B is a top-down view of the example micro-LED carrier structure 250 supported on the support stage 312, with the surface 234B of the second carrier 230B facing upward and the surface 234A of the first carrier 230A in contact with the support surface 312. FIG. 8C is the same as FIG. 8B but with the micro-LED carrier structure 250 flipped over so that the surface 234A of the first carrier 230A is facing upward and the surface 234B of the second carrier 230B in contact with the support surface 312. In each of FIGS. 8B and 8C, the micro-LEDs 20 can be seen through the substantially transparent first and second carriers 230A and 230B.

FIGS. 8B and 8C show the actinic light beam 352 directed to a select location relative to the support stage 310 and the micro-LED structure 250 supported thereon. As noted above, the alignment marks 240A and 240B reside at known positions relative to the array 8 of micro-LEDs 20 (only a couple labeled in each of FIGS. 8B and 8C for convenience. Because the position of the support stage 310 is known relative to a reference position, the scanning light beam 352 can be directed to irradiate select micro-LEDs 20 by precision movement of the support stage.

Figure 9A:
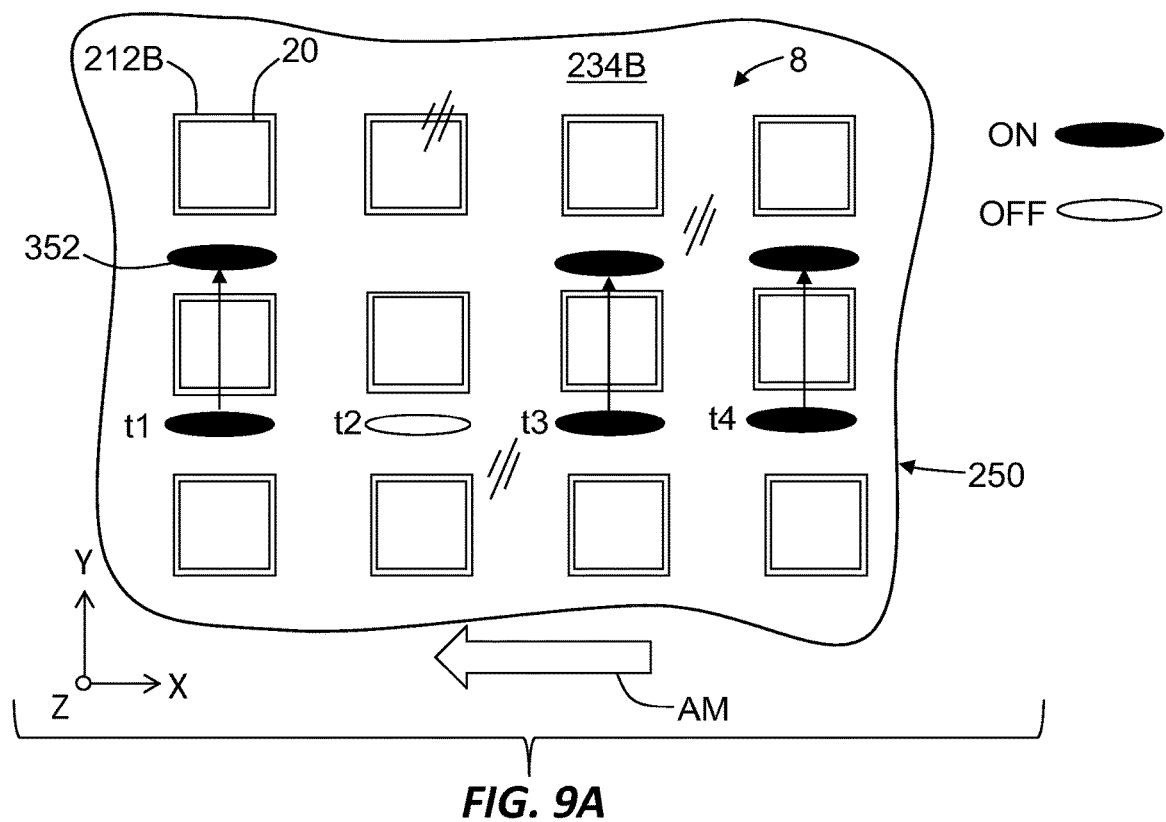
FIGS. 9A and 9B are close-up top down views of the array of micro-LEDs and the corresponding release layer for the micro-LED carrier structure configurations of FIGS. 8B and 8C, respectively, and illustrating an example of the light-based debonding process wherein the actinic light beam is scanned over the releasable securing layers for select micro-LEDs while the support stage moves the micro-LED carrier structure relative to the scanned actinic light beam.

FIG. 9A is a top-down close-up view of the micro-LED carrier structure 250 looking down through the upward-facing surface 234B of the second carrier 230B to the micro-LEDs 20 (only one labeled for convenience) sandwiched between the first and second carriers 230A and 230B (see also FIG. 3I). In an example, the actinic light beam 352 is scanned in the Y-direction to irradiate select ones of the micro-LEDs 20 in the middle row. In an example, this is accomplished by the support stage moving the micro-LED support structure 250 in the −X direction, as indicated by the movement arrow AM.

When a given micro-LED 20 (or more precisely, the segment 212B that holds the micro-LED 20 to the second carrier 230B) is to be irradiated, the actinic light beam 352 is turned on and quickly scans over the micro-LED in the Y-direction, as shown for the left-most micro-LED in the second row of FIG. 9A. The speed of the scanning actinic light beam 352 is much greater than the speed of the support stage 310 so that the support stage can move at a constant speed, i.e., it does not need to stop to accommodate the irradiation process. Note that the actinic light beam 352 only needs to be scanned over a relatively short distance, i.e., about the width W of the micro-LED 20. The scanning can be in one direction or back and forth, noting that the scanning beam moves in both the X-direction and Y-direction to account for X-direction movement of the support stage 310, as explained below. Thus, in an example, in the frame of reference of the individual micro-LED 20 being scanned, the actinic light beam moves in the Y-direction only.

Further, in an example, the actinic light beam 352 does not need to move to the next micro-LED 20 since the movement of the support stage 310 can bring the next micro-LED to the location of the actinic light beam. In another example, the actinic light beam can be moved while the support stage remains stationary.

The times t1 through t4 indicate the different times at which the scanning occurs in FIG. 9A. If the next micro-LED 20 in the row is to remain in place on the second carrier 230B, the actinic light beam 352 is turned off as the next micro-LED passes by. If the next two micro-LEDs are to be released from the second carrier 230B, then the actinic light beam 352 is turned on and scans the two micro-LEDs as they pass by, as shown in FIG. 6A. Since the securing layers 210A and 210B are respectively divided into segments 212A and 212B and the irradiation process is spatially confined, the light-based release of one of the micro-LEDs 20 does not impact adjacent micro-LEDs. Although the actinic light beam 352 is only shown to scan in the Y-direction over one micro-LED 20 in each column for ease of illustration, in an example, the actinic light beam can scan in the Y-direction over multiple micro-LEDs 20 in each column. The actinic light beam 352 is turned on or off depending on whether the micro-LED 20 is to be released.

Figure 9B:
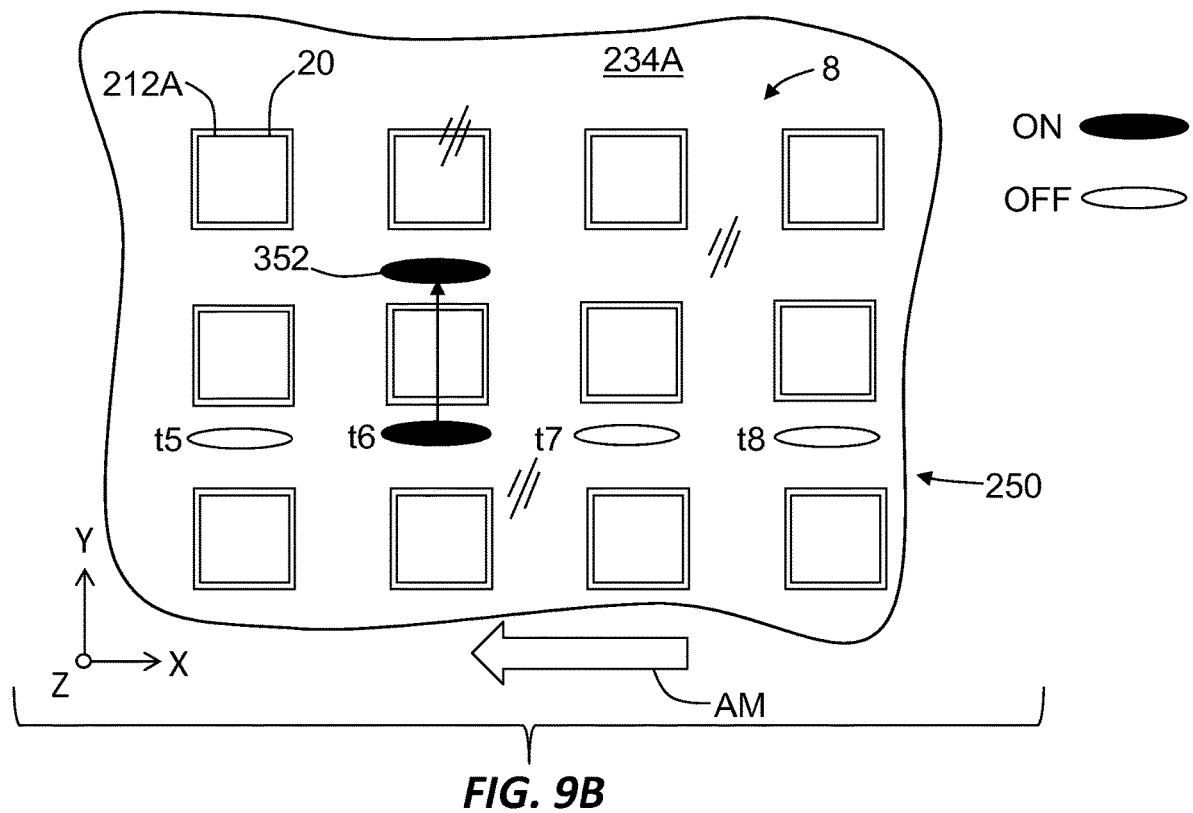

In the case of the first method, once all of the segments 212B of the micro-LEDs 20 to be released from the second carrier 230B have been irradiated, then the micro-LED carrier structure 250 is flipped over and the process is repeated for the other segments 212A holding the micro-LEDs 20 to the first carrier 230A, as illustrated in FIG. 9B. Now, only those segments 212A for the micro-LEDs 20 not previously irradiated through the second carrier 230B are irradiated. The times t5 through t8 indicate the different times for the scanning in FIG. 9B. This releases the select micro-LEDs 20 (only one labeled for convenience) from the first carrier 230A so that they can be supported by the second carrier 230B.

The irradiation apparatus 300 can be used to carry out the light-based debonding process steps used in the first or second methods described above.

Example Irradiation Apparatus

FIG. 10A is a schematic diagram of an example irradiation system 350 that can be used in the irradiation apparatus 300 introduced and discussed above.

The irradiation system 350 has an optical axis OA and includes in order along the optical axis: a light source 420, an optional collimating lens 430, an optional polarizer 440, an acousto-optical modulator (AOM) 450, a beam expanding optical system ("beam expander") 460, a first acousto-optic deflector (AOD) 470X, a first cylindrical optical system 480A, a second AOD 470Y, a second cylindrical optical system 480B and an f-θ lens 500 that defines an image plane IP. The first and second AODs 470X and 470Y are arranged orthogonal to each other, i.e., they deflect in orthogonal planes.

In an example, the light source 420 comprises a UV laser that emits a light beam 422 having a good beam quality, e.g., with $M^2 \leq 1.3$. An example laser can have a 50 W output and an output wavelength $\lambda_a$=355 nm, a pulse duration (temporal pulse length) of $\tau_P$=1.5 nanoseconds (ns) and a repetition rate $f_L$=20 MHz. This type of laser is referred to in the art as a "QCW laser", which for many applications can be considered a CW laser. In another example, the light source 420 comprises an excimer laser.

If the output light 422 is not collimated, then the collimating lens 430 is used to collimated the output light. Also, if the output light 422 requires polarization adjustment (e.g., for AOM and AOD efficiency), then the polarizer 440 can be used to adjust the polarization.

The light beam 422 propagates to the AOM 450, which works as a fast switch for turning the light beam on and off. The AOM 450 diffracts the light beam 422 to create a 0th-order light beam 422-0 and a first-order light beam 422-1. The 1st-order light beam 422-1 is used to form the final light beam 352. The 0th-order light beam is directed to a beam dump 454. When the AOM 450 is not activated, all of the light beam 422 is directed to the beam dump 454. When the AOM 450 is activated, a relatively large portion (e.g., 90%) of the original light beam 422 forms the first-order light beam 422-1. This is used to turn on and off the final light beam 352. The on/off switching time for the AOM 450 is denoted $\tau_S$ and is defined by $\tau_S$=2 w/$v_A$, where w is the $1/e^2$ radius of the light beam 422 and $v_A$ is the acoustic velocity of the AOM material, which in an example is quartz. In an example, w=0.35 mm, $v_A$=5.74 mm/μs and $\tau_S \approx 1.22$ ns. The beam radius as measured in the local x-directions and y-directions perpendicular to the optical axis OA are $w_x$ and $w_y$.

To obtain a high throughput when processing the carrier structure 250, the switching time $\tau_S$ is minimized. Since in the most demanding instances, the light beam 352 is turned on and off when processing adjacent micro-LEDs 20 in the micro-LED carrier structure 250, the switching time defines the scanning velocity of the light beam 352. The time between scanning adjacent micro-LEDs 20 is $\tau_B \geq 2\tau_S$.

The first-order light beam 422-1 travels from the AOM 450 to the beam expander 460, and enlarges the first-order light beam. In an example, the beam expander enlarges the first-order light beam 422-1 by 4× so that beam radius w goes from 0.35 mm to 1.4 mm. At this point, the expanded first-order light beam 422-1 has x and y beam radii of $w_x$=1.4 mm and $w_y$=1.4 mm.

The collimated and expanded first-order light beam 422-1 enters the first AOD 470X, which is used to provide a small deflection to compensate for X-translation of the micro-LED carrier structure 250 when the light beam 352 is scanned in the Y-direction. This keeps the scanned light beam 352 on the given micro-LED 20 being scanned while the micro-LED carrier structure 250 is moving. This X-deflection can be about 30 μm, which is on the scale of the size of the micro-LEDs 20.

The light beam 352 has a scan angle $\theta_S$. To provide an adequate scan angle $\theta_S$, the principle of conservation of etendue is employed to the symmetrical light beam 422-1 (i.e., which has $w_x$=$w_y$). Specifically, if the beam size is decreased (in the direction of diffraction) by factor of m, then the scan angle $\theta_S$ increases by the same factor of m. In the example irradiation system 350 of FIG. 10A, this is achieved by the first and second cylindrical optical systems 480A and 480B. The first cylindrical optical system 480A expands the light beam 422-1 by a first magnification factor (e.g., 4×) in the Y-direction (e.g., so that $w_x$=1.4 and $w_y$=5.6) and the second cylindrical optical system 480B reduces the light beam in the Y-direction by 3× after the beam undergoes diffraction in the Y-direction at the AOD 470Y. This simple beam manipulation increases the scan angle $\theta_S$ (in the example, by a factor of 3×) and has the side benefit of decreasing power density.

The processed light beam 422-1 exiting the second cylindrical optical system 480B proceeds to the f-θ lens 500, which defines the final light beam 352, which is directed (focused) onto the image plane IP. In an example, for small scan angles θ$_S$, the f-θ lens 500 can be configured for telecentric scanning. The scan length is denoted LS and is defined by the scan angle θ$_S$ and a working distance WD between the f-θ lens 500 and the image plane IP. In an example, the scan length LS can be set to about 3 mm and the working distance WD (which is the focal length of the f-θ lens 500) is about 200 mm.

With reference to FIGS. 10B and 10C, if the scanning light beam 352 is made incident at the micro-LED carrier structure 250 at an incident angle θ$_i$ of 45 degrees (see FIG. 5A), then the example light beam will have a long dimension LX of about 27 μm and a short dimension LY of 14 μm at the image plane IP. Other dimensions w$_x$ and w$_y$ can be imparted to the light beam 352 by the first and second cylindrical optical systems 480A and 480B, depending on its incident angle θ$_i$ so that the light beam can have select dimensions at the micro-LED carrier structure 250.

The scanning of the light beam 352 over select micro-LEDs 20 requires timing. For a QCW light source 420, a number n$_p$ of pulses is used for each scan. In an example, n$_p$ is in the range from 5 to 15, with 10 being an exemplary value, to average over any pulse-to-pulse energy variations.

For a scan length LS=3 mm and a micro-LED size w=20 μm, the scan time $\tau_{SCAN}$=[LS/w]·0.50 ns·n$_p$=50 ns·(3 mm)/(20×10$^{-3}$ mm)=75 μs, with a scan velocity v$_{SCAN}$=40 m/s. During the scan time, the support stage 310 (see FIG. 5A) moves a distance DS=$\tau_{SCAN}$·v$_{STAGE}$=30 μm for stage velocity v$_{STAGE}$=400 mm/s. As noted above, this distance is on the order of the size w of a micro-LED and so needs to be compensated for by using the first AOD 470X.

Once a scan of the light beam 352 over a given micro-LED 20 is completed, there is a time delay t$_D$ before starting the next scan of the light beam. This time delay t$_D$ is based on the separation S between adjacent micro-LEDs, and for S=10 μm and v$_{SCAN}$=400 mm/s, the time delay t$_D$=S/V$_{SCAN}$=(10 μm)/(400×10$^3$ μm/s)=25 μs. This time is sufficient for the AOM 450 to turn the light beam 352 on and off between scans.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of transferring a device from a first carrier to a second carrier, comprising:
   a) bonding the device to the first carrier using a first releasable bonding layer that releases when exposed to actinic light;
   b) securing the device to the second carrier using a second releasable bonding layer that releases when exposed to actinic light; and
   c) irradiating the first releasable bonding layer through the first carrier with the actinic light to release the device from the first carrier.

2. The method according to claim 1, wherein the act of irradiating comprises scanning the actinic light over the releasable bonding layer.

3. The method according to claim 1, wherein the device comprises a micro-LED and the method further comprises transferring the micro-LED from a donor wafer to the first carrier prior to the act of securing the micro-LED to the second carrier.

4. The method according to claim 1, wherein the first releasable bonding layer includes a release material and an adhesive material, wherein the release material is deposited onto a surface of the first carrier and the adhesive material is deposited onto a surface of the device, the method further comprising:
   forming the first releasable bonding layer by contacting the release material of the first carrier to the adhesive material of the device.

5. The method according to claim 1, wherein the device comprises a micro-LED and the second carrier comprises a display backplane having a bonding pad, the method further comprising:
   transferring the micro-LED from the first carrier to the bonding pad; and
   operably securing the transferred micro-LED to the bonding pad.

6. The method according to claim 1, wherein the act b) of securing the device to the second carrier is performed prior to the act a) of bonding the device to the first carrier.

7. The method according to claim 6, further comprising after releasing the device from the first carrier:
   transferring the device from the second carrier to a bonding pad on a display backplane by irradiating the second releasable bonding layer through the second carrier to release the device from the second carrier; and
   operably bonding the device to the bonding pad.

8. A method of transferring one or more of multiple micro-LEDs from a first carrier to a second carrier, comprising:
   a) bonding the multiple micro-LEDs to the first carrier using respective first releasable bonding segments that release when exposed to actinic light;
   b) securing the multiple micro-LEDs to the second carrier;
   c) irradiating one or more of the first releasable bonding segments through the first carrier with the actinic light to release one or more of the multiple micro-LEDs from the first carrier; and
   d) selectively releasing the other of the one or more multiple micro-LEDs from the second carrier so that only said one or more of the multiple micro-LEDs are supported only by the second carrier and so that only said other of the one or more multiple micro-LEDs is supported by the first carrier.

9. The method according to claim 8, wherein the act c) of irradiating the one or more first releasable bonding segments comprises sequentially scanning the actinic light over each of the one or more first releasable bonding segments.

10. The method according to claim 8, further comprising prior to act a):
    transferring the multiple micro-LEDs from a donor wafer to the first carrier.

11. The method according to claim 10, further comprising forming the first releasable bonding segments by:
    depositing a release material onto a surface of the first carrier as a first layer;
    depositing an adhesive material onto a surface of the micro-LED as a second layer;
    contacting the first and second layers to form a first releasable bonding layer; and
    patterning the first releasable bonding layer to define the first releasable bonding segments.

12. The method according to claim 8, wherein the multiple micro-LEDs are secured to the second carrier using respective second releasable bonding segments that release when exposed to actinic light, the method further comprising:

transferring the micro-LEDs from the second carrier to respective one or more bonding pads on a display backplane by irradiating the second releasable bonding segments of the one or more micro-LEDs through the second carrier with actinic light to release the micro-LEDs from the second carrier; and operably bonding the one or more transferred micro-LEDs to their respective one or more bonding pads.

13. The method according to claim 8, further comprising:
transferring the micro-LEDs from the first carrier to respective one or more bonding pads on a display backplane by irradiating the first releasable bonding segments that hold the micro-LEDs of the first carrier through the first carrier with actinic light to release the micro-LEDs from the first carrier.

14. The method according to claim 13, further comprising:

operably bonding the one or more transferred micro-LEDs to their respective one or more bonding pads using a thermal process.

15. The method according to claim 8, wherein the act of securing the micro-LEDs to the second carrier forms a micro-LED carrier structure, and further comprising:

supporting the micro-LED carrier structure on a support stage of an irradiation apparatus that generates the actinic light so that either of the first or second carrier is in contact with the support stage;

performing either the act c) or the act d) on the micro-LED carrier structure using the irradiation apparatus; and flipping over the micro-LED carrier structure so that the other of the first and second carrier is in contact with the support stage and performing the other of the act c) or the act d) using the irradiation apparatus.

16. A method of transferring one or more of multiple micro-LEDs from a first carrier to a second carrier, comprising:

a) bonding the multiple micro-LEDs to the first carrier using a layer of a releasable bonding material that releases when exposed to actinic light;

b) securing select micro-LEDs of the multiple micro-LEDs to the second carrier using respective segments of the releasable bonding material; and c) irradiating the first releasable bonding layer through the first carrier with the actinic light to release the select multiple micro-LEDs from the first carrier so that the select micro-LEDs are supported on the second carrier by the respective segments of the releasable bonding material.

17. The method according to claim 16, further comprising prior to act a):

transferring the multiple micro-LEDs from a donor wafer to the first carrier.

18. The method according to claim 17, wherein the act of transferring the multiple micro-LEDs from a donor wafer to the first carrier includes a mechanical lift-off operation, a laser lift-off operation, or use of a wet etch.

19. The method according to claim 17, further comprising forming a support layer on the donor wafer.

20. The method according to claim 19, wherein the support layer is configured for at least one of (1) use for the laser lift-off operation, (2) use as a hard mask, or (3) to flatten the donor wafer.

21. The method according to claim 20, wherein a stress of the support layer is controlled during application of the support layer to the donor wafer to flatten the donor wafer.

22. The method according to claim 16, wherein the second carrier includes mesas, the respective segments of the releasable bonding material located on the mesas.

23. The method according to claim 22, wherein the multiple micro-LEDs have a size and location, and wherein the segments of the releasable bonding material and the mesas have a size and a location that is designed and configured to align with a subset of the multiple micro-LEDs.

24. The method according to claim 16, wherein prior to the act b) of securing, removing portions of the layer of releasable bonding material extending between adjacent micro-LEDs to form a patterned layer of releasable bonding material that includes segments located between the micro-LEDs and the first carrier.

25. The method according to claim 24, wherein the step of removing includes use of a dry etch process to remove the portions of the layer of releasable bonding material.

* * * * *